US012784640B2

(12) United States Patent
Lin et al.

(10) Patent No.: US 12,784,640 B2
(45) Date of Patent: Nov. 3, 2026

(54) GATE DRIVING CIRCUIT, DISPLAY PANEL, AND DISPLAY DEVICE

(71) Applicant: Xiamen Tianma Display Technology Co., Ltd., Xiamen (CN)

(72) Inventors: Lizi Lin, Xiamen (CN); Yana Gao, Xiamen (CN); Xingyao Zhou, Xiamen (CN); Zhiqiang Xia, Xiamen (CN); Kang Yang, Xiamen (CN)

(73) Assignee: Xiamen Tianma Display Technology Co., Ltd., Xiamen (CN)

( * ) Notice: Subject to any disclaimer, the term of this patent is extended or adjusted under 35 U.S.C. 154(b) by 0 days.

(21) Appl. No.: 19/175,575

(22) Filed: Apr. 10, 2025

(65) Prior Publication Data

US 2025/0239202 A1 Jul. 24, 2025

(30) Foreign Application Priority Data

Dec. 26, 2024 (CN) ......................... 202411943328.7

(51) Int. Cl.
*G09G 3/20* (2006.01)
*G11C 19/28* (2006.01)

(52) U.S. Cl.
CPC ........... *G09G 3/2092* (2013.01); *G11C 19/28* (2013.01); *G09G 2310/0267* (2013.01); *G09G 2310/0286* (2013.01); *G09G 2310/061* (2013.01); *G09G 2310/08* (2013.01)

(58) Field of Classification Search
CPC ......... G09G 3/2092; G09G 2310/0286; G09G 3/3266; G09G 2310/08; G09G 2310/0267; G09G 3/3674
See application file for complete search history.

(56) References Cited

U.S. PATENT DOCUMENTS

| | | | | |
|---|---|---|---|---|
| 12,106,722 | B2 * | 10/2024 | Qing .................... | G09G 3/3266 |
| 2023/0267881 | A1 * | 8/2023 | Feng .................... | G09G 3/3233<br>345/214 |
| 2024/0355295 | A1 * | 10/2024 | Sun ...................... | G09G 3/3266 |

* cited by examiner

*Primary Examiner* — Scott D Au
(74) *Attorney, Agent, or Firm* — KDW FIRM PLLC

(57) ABSTRACT

Provided are a gate driving circuit, a display panel, and a display device. The gate driving circuit includes multiple cascaded shift registers. A shift register includes a first input unit, a second input unit, a first output unit, a second output unit, a first reset unit and a turn-off unit. The first reset unit is configured to write a turn-off voltage into a first node; the gate of the first reset transistor is connected to a first clock signal terminal or a third clock signal terminal; a first electrode of the first reset transistor is connected to a first node; and a first terminal of the turn-off unit is connected to a second electrode of the first reset transistor and is configured to write a turn-on voltage into the second electrode of the first reset transistor when the first node controls the turn-off unit to turn on.

20 Claims, 20 Drawing Sheets

GATE DRIVING CIRCUIT, DISPLAY PANEL, AND DISPLAY DEVICE

CROSS-REFERENCE TO RELATED APPLICATION(S)

This application claims priority to Chinese Patent Application No. 202411943328.7 filed with China National Intellectual Property Administration (CNIPA) on Dec. 26, 2024, the disclosure of which is incorporated herein by reference in its entirety.

TECHNICAL FIELD

This disclosure relates to the field of display technology, in particular to a gate driving circuit, a display panel, and a display device.

BACKGROUND

The display panel generally includes a display area and a non-display area. The display area is provided with multiple pixel driving circuits and light-emitting elements. The pixel driving circuits are used to drive the light-emitting elements to emit light to display an image. The non-display area is provided with a gate driving circuit for providing a control signal to the pixel driving circuits so that the light-emitting elements are lit row by row under the drive of the pixel driving circuits.

In the related art, the gate driving circuit has a leakage problem.

SUMMARY

A gate driving circuit, a display panel, and a display device are provided according to the present disclosure to reduce the leakage of a shift register and reduce the leakage of the gate driving circuit.

In a first aspect, a gate driving circuit is provided according to embodiments of the present disclosure and includes multiple cascaded shift registers. The shift register includes a first input unit, a second input unit, a first output unit, a second output unit, a first reset unit and a turn-off unit.

An output terminal of the first input unit and a control terminal of the first output unit are connected to a first node, and an output terminal of the second input unit and a control terminal of the second output unit are connected to a third node.

The first reset unit is configured to write a turn-off voltage into the first node, and the turn-off voltage is a voltage for controlling the first output unit to turn off; the first reset unit includes a first reset transistor, a gate of the first reset transistor is connected to a first clock signal terminal or a third clock signal terminal, and a first electrode of the first reset transistor is connected to the first node.

A control terminal of the turn-off unit is connected to the first node, and a first terminal of the turn-off unit is connected to a second electrode of the first reset transistor and is configured to write a turn-on voltage into the second electrode of the first reset transistor, when the first node controls the turn-off unit to turn on, and the turn-on voltage is a voltage for controlling the first output unit to turn on.

In a second aspect, a display panel is provided according to an embodiment of the present disclosure and includes the gate driving circuit described in the first aspect.

In a third aspect, a display device is provided according to an embodiment of the present disclosure and includes the display panel described in the second aspect.

DETAILED DESCRIPTION

The present disclosure is further described in detail hereinafter in conjunction with the drawings and embodiments. It is understood that the embodiments described herein are only intended to explain the present disclosure, not to limit the present disclosure. It is further necessary to explain that, for the convenience of description, only part of the structure related to the present disclosure is shown in the accompanying drawings, not all.

Figure 1:
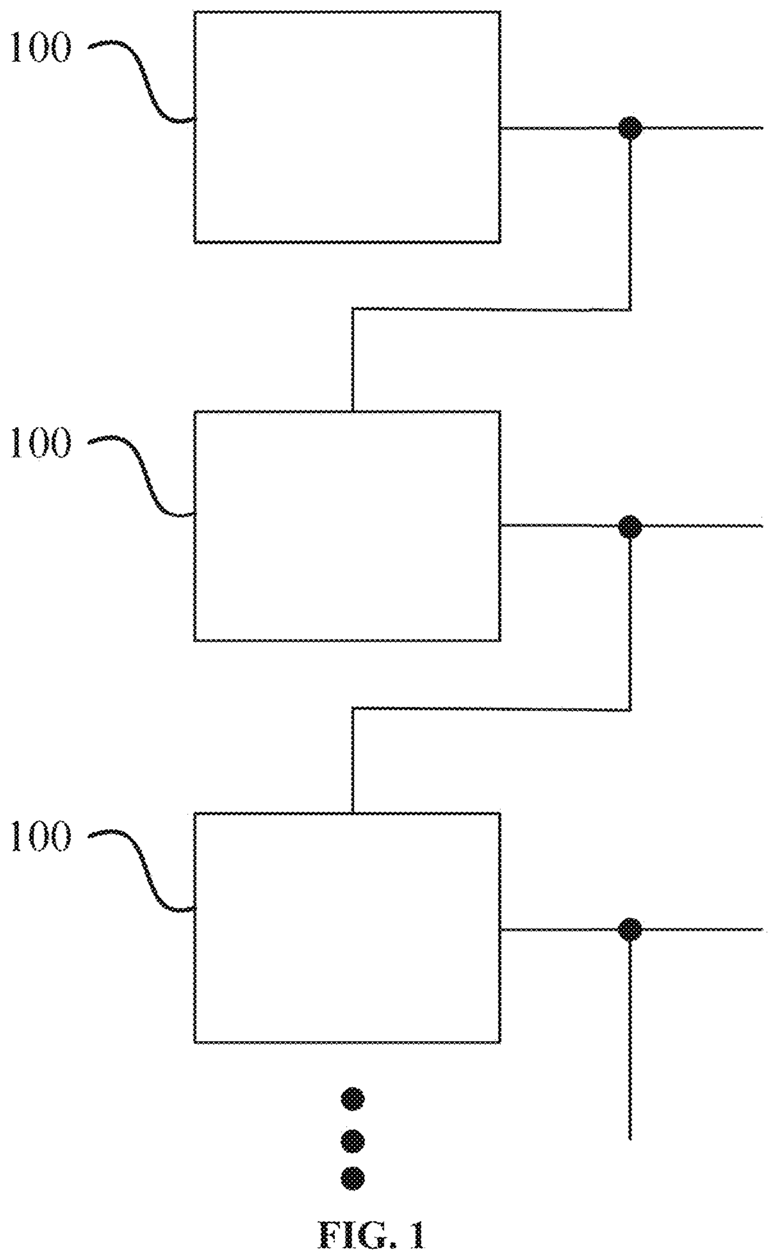
FIG. 1 is a circuit diagram of a gate driving circuit provided in an embodiment of the present disclosure.
Figure 2:
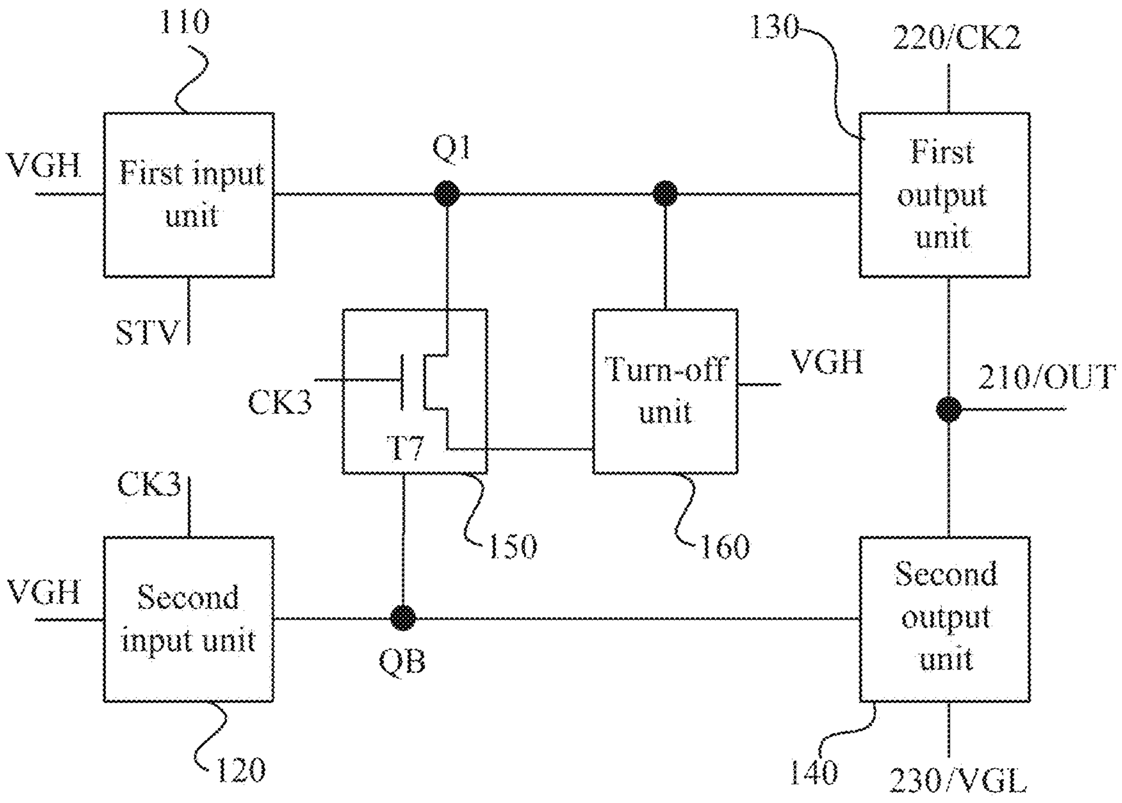
FIG. 2 is a circuit diagram of a shift register provided in an embodiment of the present disclosure.

FIG. 1 is a circuit diagram of a gate driving circuit provided in an embodiment of the present disclosure. FIG. 2 is a circuit diagram of a shift register provided in an embodiment of the present disclosure. Referring to FIG. 1 and FIG. 2, the gate driving circuit includes multiple cascaded shift registers 100. The shift register 100 includes a first input unit 110, a second input unit 120, a first output unit 130, a second output unit 140, a first reset unit 150, and a turn-off unit 160. An output terminal of the first input unit 110 and a control terminal of the first output unit 130 are connected to a first node Q1. The output terminal of the first input unit 110 is coupled to the first node Q1, and the control terminal of the first output unit 130 is coupled to the first node Q1. An output terminal of the second input unit 120 and a control terminal of the second output unit 140 are connected to a third node QB.

The first reset unit 150 is configured to write a turn-off voltage into the first node Q1, and the turn-off voltage is used for controlling the first output unit 130 to turn off. The turn-off voltage may also be used for controlling the second output unit 140 to turn off. The first reset unit 150 includes a first reset transistor T7, and a gate of the first reset transistor T7 is connected to a first clock signal terminal CK1 or a third clock signal terminal CK3. The first reset transistor T7 is turned on or off under the control of the first clock signal terminal CK1. Alternatively, the first reset transistor T7 is turned on or off under the control of the third clock signal terminal CK3. The first clock signal terminal CK1 and the third clock signal terminal CK3 provide clock signals. A first electrode of the first reset transistor T7 is connected to the first node Q1.

A control terminal of the turn-off unit 160 is connected to the first node Q1, and a first terminal of the turn-off unit 160 is connected to a second electrode of the first reset transistor T7. The turn-off unit 160 is configured to write a turn-on voltage into the second electrode of the first reset transistor T7 when the first node Q1 controls the turn-off unit 160 to turn on, and the turn-on voltage is the voltage for controlling the first output unit 130 to turn on. The turn-on voltage may further be the voltage for controlling the second output unit 140 to turn on.

In the gate driving circuit provided in the embodiment of the present disclosure, the turn-off unit 160 is provided, and the control terminal of the turn-off unit 160 is connected to the first node Q1. When the voltage of the first node Q1 is the turn-on voltage, the turn-off unit 160 is turned on and writes the turn-on voltage into the second electrode of the first reset transistor T7. The first electrode of the first reset transistor T7 and the second electrode of the first reset transistor T7 are both at the turn-on voltage. The gate of the first reset transistor T7 is at a turn-off voltage, in this way, the turn-on voltage applied to the second electrode of the first reset transistor T7 turns off the first reset transistor T7 more thoroughly, thereby reducing the leakage through the first reset transistor T7, and reducing the leakage of the circuit branch where the first node Q1 and the first reset unit 150 are located. The leakage refers to the leakage current in the off state or a voltage change caused by leakage.

Exemplarily, the gate driving circuit includes multiple thin film transistors, and at least one of the multiple thin film transistors is an oxide transistor. A semiconductor layer of the oxide transistor includes a metal oxide. The metal oxide may include, for example, indium gallium zinc oxide (IGZO).

Exemplarily, the thin film transistor includes an N-type transistor. The gate of the N-type transistor is turned on under the control of a positive voltage (including a high level), and the gate of the N-type transistor is turned off under the control of a negative voltage. For an N-type transistor, the turn-off voltage is a negative voltage (including a low level), and the turn-on voltage is a positive voltage. In other embodiments, the thin film transistor includes a P-type transistor. The gate of the P-type transistor is turned off under the control of a positive voltage, and the gate of the P-type transistor is turned on under the control of a negative voltage. For a P-type transistor, the turn-off voltage is a positive voltage, and the turn-on voltage is a negative voltage. The positive voltage is greater than the negative voltage. For the sake of simplicity, in various embodiments of the present disclosure, the thin film transistor including an N-type transistor is taken as an example for explanation, but it is not limited to this.

For example, the first reset transistor T7 is an N-type transistor. The turn-off voltage is a negative voltage, and the turn-on voltage is a positive voltage. The first electrode of the first reset transistor T7 and the second electrode of the first reset transistor T7 are both at positive voltages, the gate of the first reset transistor T7 is at a negative voltage, and the gate-source voltage difference of the first reset transistor T7 is an extremely negative value. Thus, the first reset transistor T7 is turned off more thoroughly, thereby reducing the leakage through the first reset transistor T7.

Figure 3:
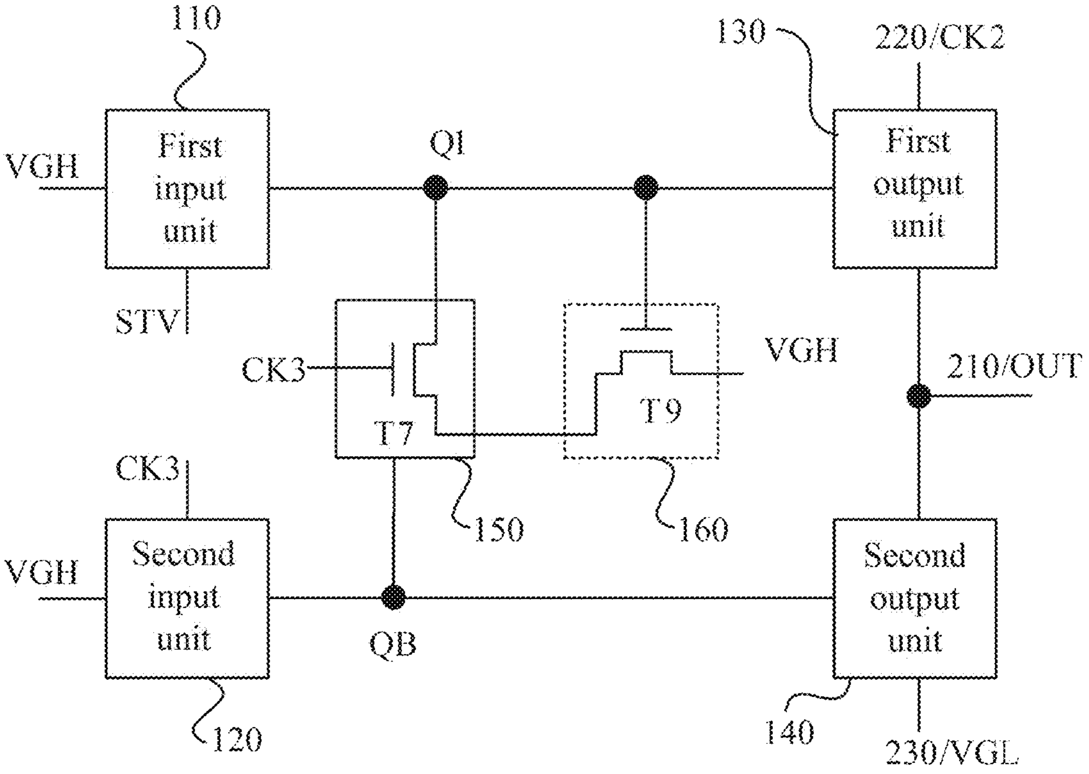
FIG. 3 is another circuit diagram of a shift register provided in an embodiment of the present disclosure.

FIG. 3 is another circuit diagram of a shift register provided in an embodiment of the present disclosure. Referring to FIG. 3, the turn-off unit 160 includes a turn-off transistor T9. A gate of the turn-off transistor T9 is connected to the first node Q1, and a first electrode of the turn-off transistor T9 is connected to the second electrode of the first reset transistor T7. When the turn-off transistor T9 is turned on, the turn-off transistor T9 writes the turn-on voltage into the second electrode of the first reset transistor T7.

In one or more embodiments, referring to FIG. 3, a second electrode of the turn-off transistor T9 is connected to a first power supply voltage terminal VGH, and the first power supply voltage terminal VGH provides the turn-on voltage. During the period when the turn-off transistor T9 is turned on, the turn-off transistor T9 can write the turn-on voltage of the first power supply voltage terminal VGH into the second electrode of the first reset transistor T7, which increases the length of time for completely turning off the first reset transistor T7 and further improves the effect of reducing the leakage of the gate driving circuit.

Exemplarily, referring to FIG. 3, when the first node Q1 is at a positive voltage, the positive voltage of the first node Q1 controls the turn-off transistor T9 to turn on to write the positive voltage of the first power supply voltage terminal VGH into the second electrode of the first reset transistor T7.

In an embodiment, the voltage of the first power supply voltage terminal VGH is a high level, and the high level may be greater than or equal to 8 V. In other embodiments, the voltage of the first power supply voltage terminal VGH may also be a low level, and the low level is less than or equal to −8 V.

Figure 4:
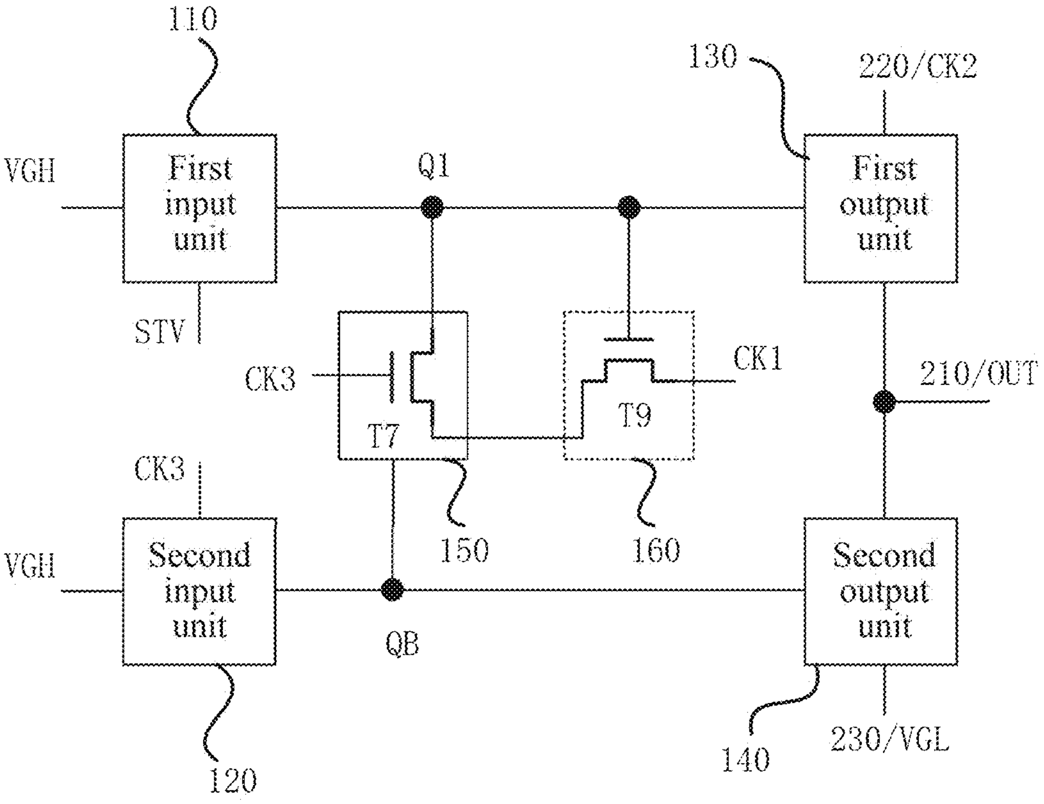
FIG. 4 is another circuit diagram of a shift register provided in an embodiment of the present disclosure.

FIG. 4 is another circuit diagram of a shift register provided in an embodiment of the present disclosure. Referring to FIG. 4, the second electrode of the turn-off transistor T9 is connected to the first clock signal terminal CK1. During the period when the clock signal provided by the first clock signal terminal CK1 is the turn-on voltage, the turn-on voltage can be written into the second electrode of the first reset transistor T7.

Figure 5:
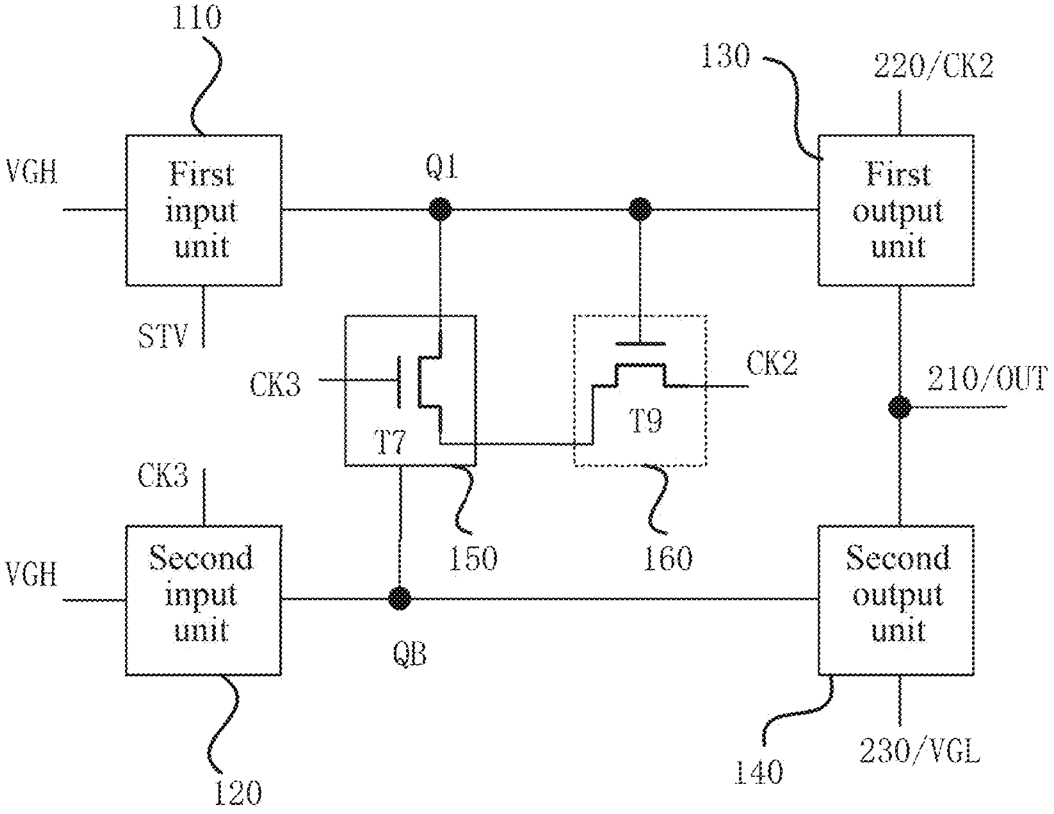
FIG. 5 is another circuit diagram of a shift register provided in an embodiment of the present disclosure.

FIG. 5 is another circuit diagram of a shift register provided in an embodiment of the present disclosure. Referring to FIG. 5, the second electrode of the turn-off transistor T9 is connected to the second clock signal terminal 220. During the period when the clock signal provided by the second clock signal terminal 220 is the turn-on voltage, the turn-on voltage can be written into the second electrode of the first reset transistor T7.

Figure 6:
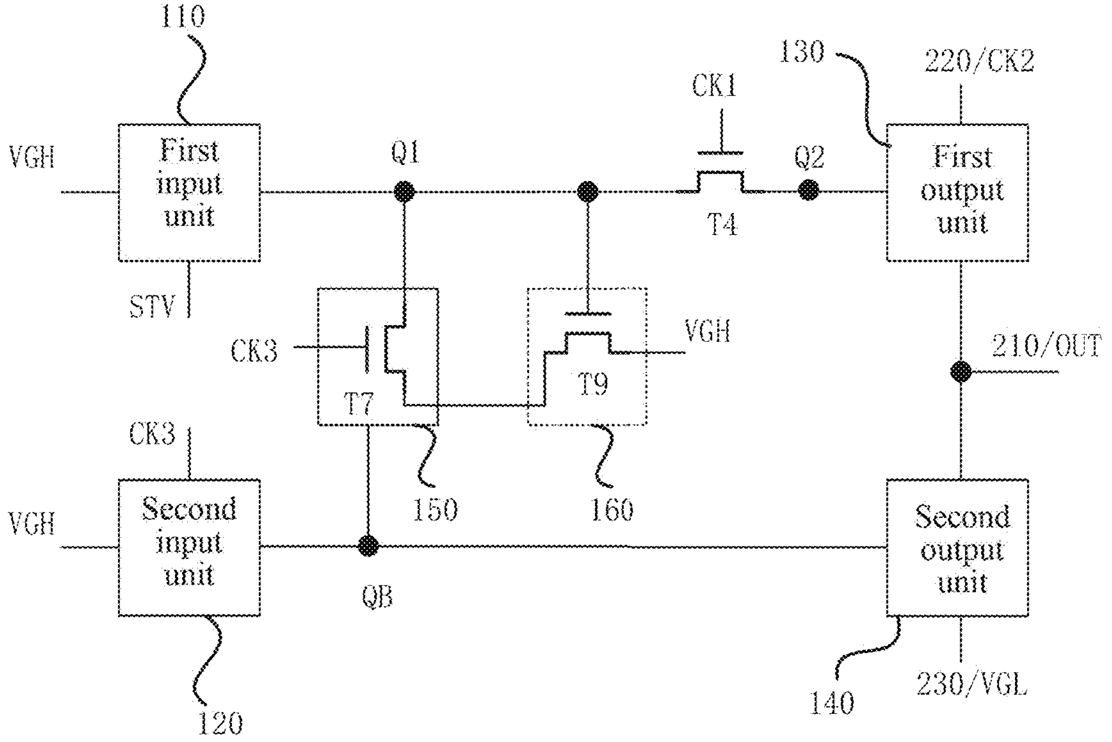
FIG. 6 is another circuit diagram of a shift register provided in an embodiment of the present disclosure.

FIG. 6 is another circuit diagram of a shift register provided in an embodiment of the present disclosure. Referring to FIG. 1 and FIG. 6, the shift register 100 further includes an isolation transistor T4. A gate of the isolation transistor T4 is connected to the first clock signal terminal CK1, a first electrode of the isolation transistor T4 is connected to the first node Q1, and a second electrode of the isolation transistor T4 and the control terminal of the first output unit 130 are connected to a second node Q2.

For example, referring to FIG. 6, the isolation transistor T4 is an N-type transistor. The turn-off voltage is a negative voltage, and the turn-on voltage is a positive voltage. During the period when the clock signal provided by the first clock signal terminal CK1 is a positive voltage, the isolation transistor T4 is turned on, and the first node Q1 and the second node Q2 have the same voltage. During the period when the clock signal provided by the first clock signal terminal CK1 is a negative voltage, the isolation transistor T4 is turned off, and the first node Q1 and the second node Q2 have the same or different voltages.

Figure 7:
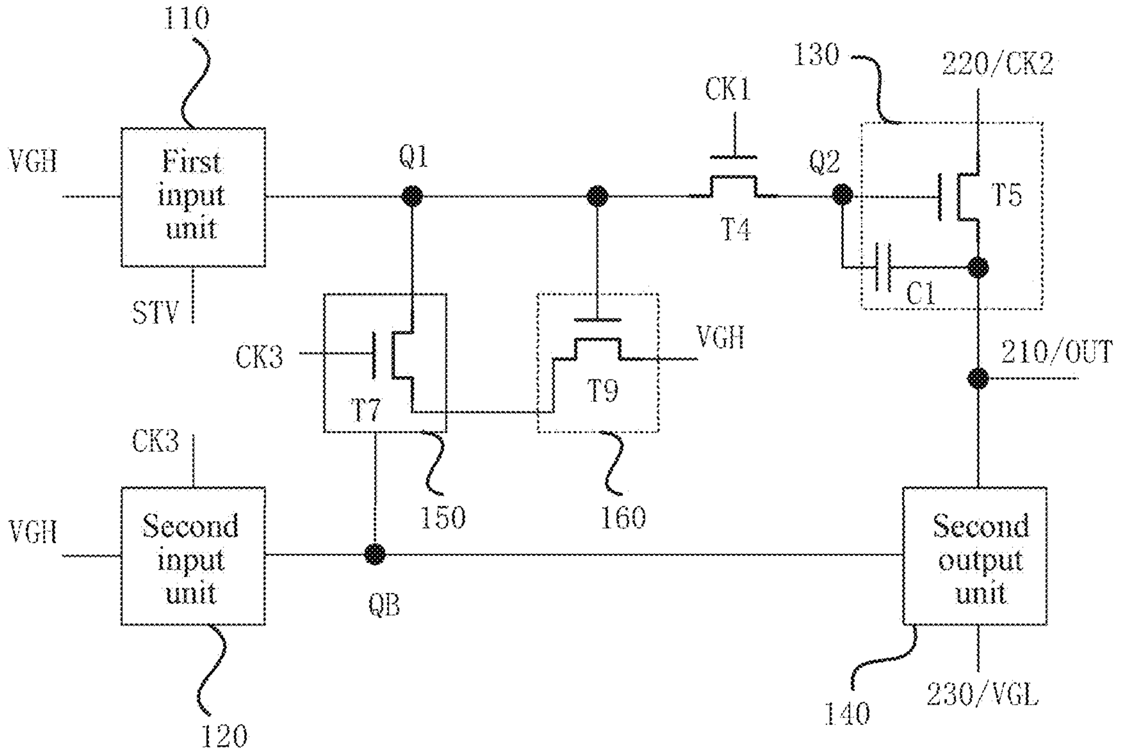
FIG. 7 is another circuit diagram of a shift register provided in an embodiment of the present disclosure.

FIG. 7 is another circuit diagram of a shift register provided in an embodiment of the present disclosure. Referring to FIG. 7, the first output unit 130 includes a first output transistor T5 and a first capacitor C1. A gate of the first output transistor T5 is connected to the second node Q2, a first electrode of the first output transistor T5 is connected to the second clock signal terminal 220, and a second electrode of the first output transistor T5 is connected to an output signal terminal 210. The second node Q2 has a different voltage from that of the first node Q1. Due to the bootstrap effect of the first capacitor C1, the voltage of the second node Q2 is set to turn on the first output unit 130 more thoroughly, thereby improving the voltage transmission capability of the first output unit 130 and improving the driving capability of the enable voltage output by the output signal terminal 210.

Exemplarily, referring to FIG. 7, the first output transistor T5 is an N-type transistor. The turn-off voltage is a negative voltage, and the turn-on voltage is a positive voltage. Due to the bootstrap effect of the first capacitor C1, the voltage of the second node Q2 is coupled to a higher potential by the first capacitor C1. The higher the gate voltage of the first output transistor T5 reaches, the more thoroughly the first output transistor T5 is turned on, and the stronger the capability of transmitting voltage of the first output transistor T5 is, thereby improving the driving capability of the enable voltage output by the output signal terminal 210.

Figure 8:
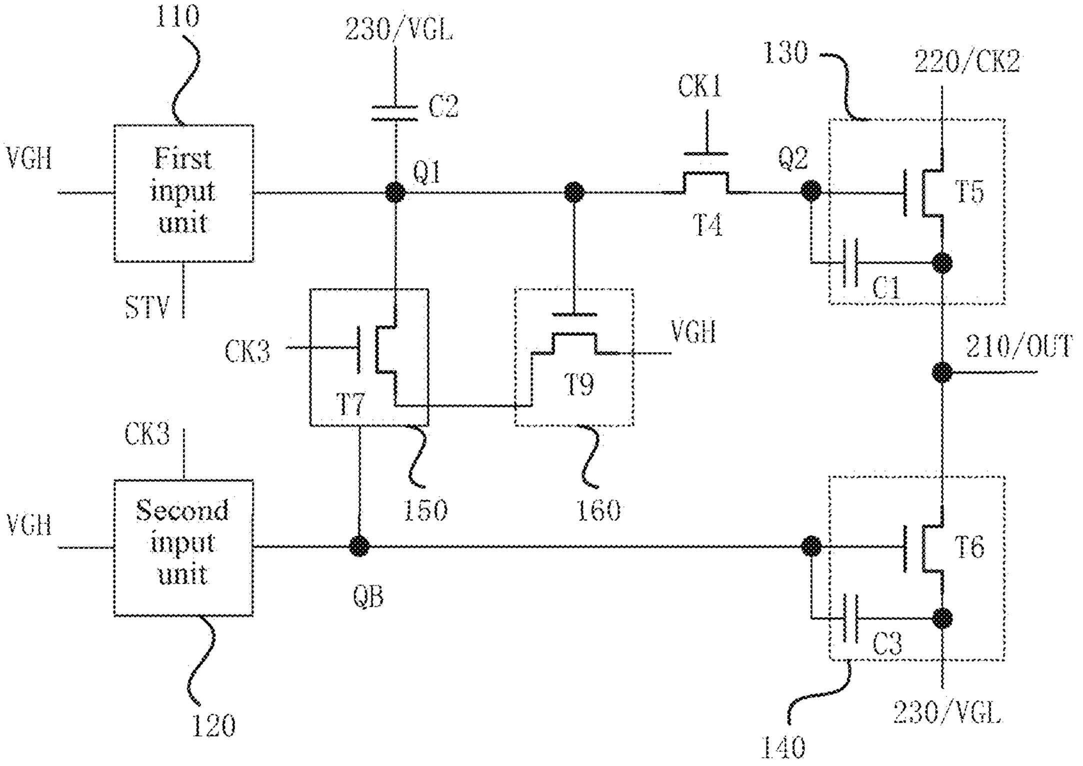
FIG. 8 is another circuit diagram of a shift register provided in an embodiment of the present disclosure.

FIG. 8 is another circuit diagram of a shift register provided in an embodiment of the present disclosure. Referring to FIG. 1 and FIG. 8, the shift register 100 further includes a second capacitor C2, a first plate of the second capacitor C2 is connected to the first node Q1, and a second plate of the second capacitor C2 is connected to a second power supply voltage terminal 230. The second power supply voltage terminal 230 provides a turn-off voltage. The capacitance value of the second capacitor C2 is greater than that of the first capacitor C1. Therefore, when the isolation transistor T4 is turned on, the second capacitor C2 with a larger capacitance value is set to change the voltage of the second node Q2 toward the voltage of the first node Q1. For example, the voltage of the first node Q1 is less than the voltage of the second node Q2. When the isolation transistor T4 is turned on, the second capacitor C2 with a larger capacitance value is set to pull the voltage of the second node Q2 down to the voltage of the first node Q1. Thus, the voltage reset effect of the second node Q2 is achieved.

For example, referring to FIG. 8, the second output unit 140 includes a third output transistor T6 and a third capacitor C3, a gate of the third output transistor T6 is connected to the third node QB, a first electrode of the third output transistor T6 is connected to the second power supply voltage terminal 230, and the second power supply voltage terminal 230 provides a turn-off voltage. For example, the voltage of the second power supply voltage terminal 230 is a low level, and the low level is, for example, less than or equal to −8 V. In other embodiments, the voltage of the second power supply voltage terminal 230 may also be a high level, and the high level is greater than or equal to 8 V. A second electrode of the third output transistor T6 is connected to the output signal terminal 210. A first plate of the third capacitor C3 is connected to the third node QB, and a second plate of the third capacitor C3 is connected to the second power supply voltage terminal 230. The third capacitor C3 is configured to maintain the voltage of the third node QB.

Figure 9:
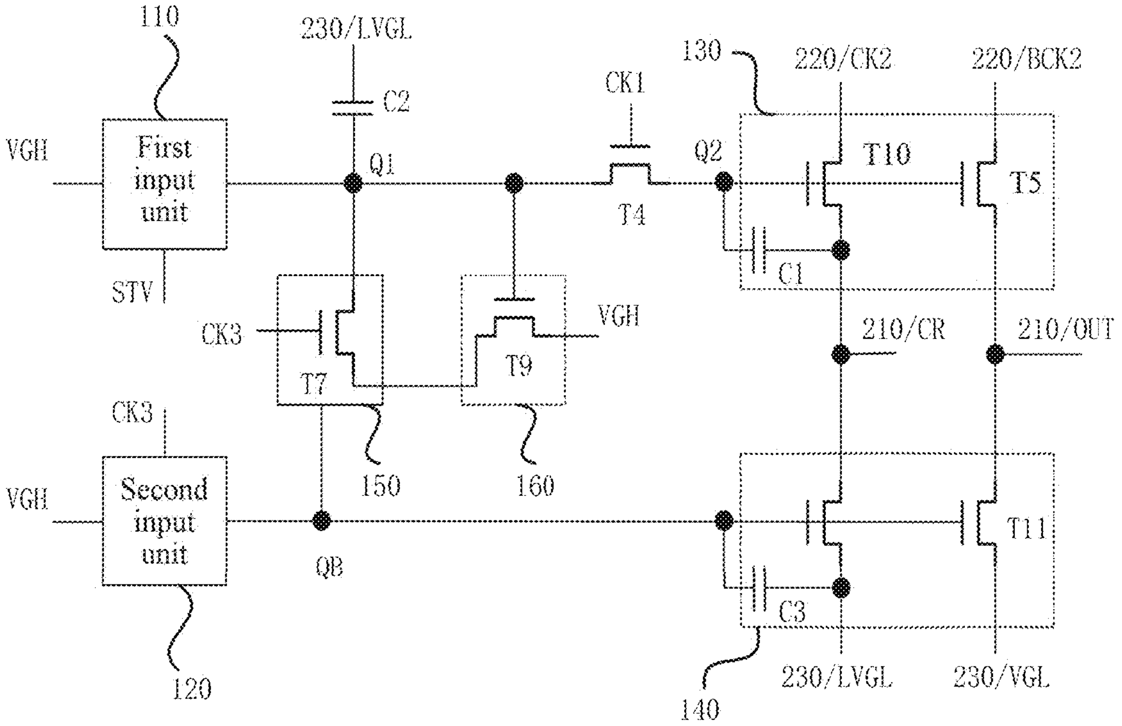
FIG. 9 is another circuit diagram of a shift register provided in an embodiment of the present disclosure.

FIG. 9 is another circuit diagram of a shift register provided in an embodiment of the present disclosure. Referring to FIG. 9, the second clock signal terminal 220 includes a second clock first sub-signal terminal CK2 and a second clock second sub-signal terminal BCK2. The second clock first sub-signal terminal CK2 and the second clock second sub-signal terminal BCK2 provide voltages with the same timing and different voltage values. The same timing means that the second clock first sub-signal terminal CK2 and the second clock second sub-signal terminal BCK2 have a turn-on voltage at the same time in the same period, and have a turn-off voltage at the same time in the same period. The output signal terminal 210 includes a first output signal terminal OUT and a second output signal terminal CR. The first electrode of the first output transistor T5 is connected to the second clock second sub-signal terminal BCK2, and the second electrode of the first output transistor T5 is connected to the first output signal terminal OUT. The first output unit 130 further includes a second output transistor T10, a gate of the second output transistor T10 is connected to the second node Q2, a first electrode of the second output transistor T10 is connected to the second clock first sub-signal terminal CK2 or the second clock second sub-signal terminal BCK2, and a second electrode of the second output transistor T10 is connected to the second output signal terminal CR.

Exemplarily, referring to FIG. 9, the voltage of the second clock second sub-signal terminal BCK2 at the low level is less than the voltage of the second clock first sub-signal terminal CK2 at the low level.

Figure 10:
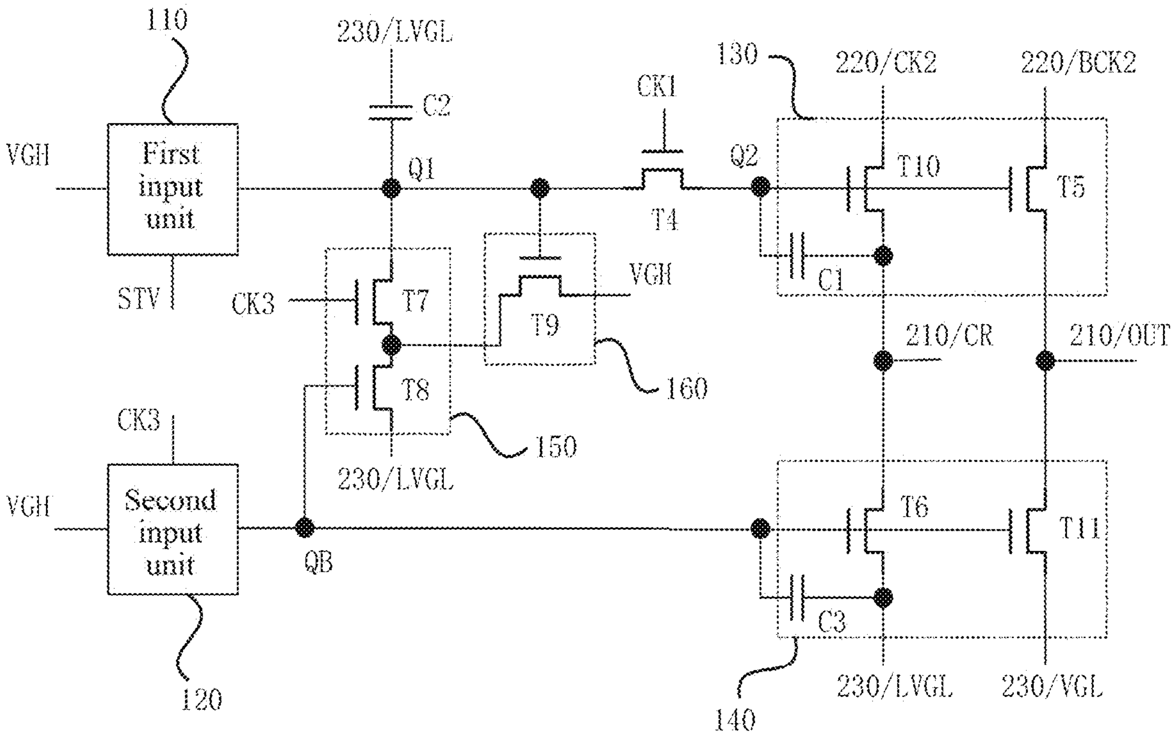
FIG. 10 is another circuit diagram of a shift register provided in an embodiment of the present disclosure.

FIG. 10 is another circuit diagram of a shift register provided in an embodiment of the present disclosure. Referring to FIG. 10, the first reset unit 150 further includes a second reset transistor T8, a gate of the second reset transistor T8 is connected to the third node QB, a first electrode of the second reset transistor T8 is connected to the second electrode of the first reset transistor T7, and a second electrode of the second reset transistor T8 is connected to the second power supply voltage terminal 230. The second power supply voltage terminal 230 provides a turn-off voltage. The turn-on voltage applied to the second electrode of the first reset transistor T7 turns off the first reset transistor T7 more thoroughly, reduces the leakage through the first reset transistor T7, and reduces the leakage of the circuit branch where the first node Q1, the first reset transistor T7, the second reset transistor T8, the second power supply voltage terminal 230 are located.

Figure 11:
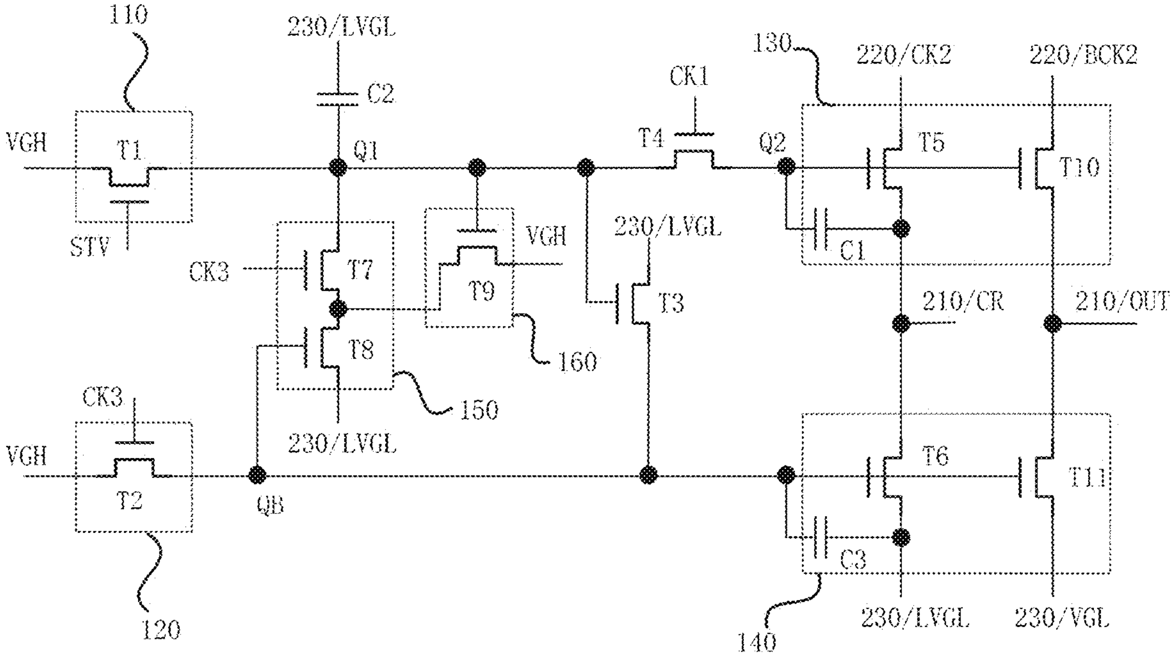
FIG. 11 is another circuit diagram of a shift register provided in an embodiment of the present disclosure.

FIG. 11 is another circuit diagram of a shift register provided in an embodiment of the present disclosure. Referring to FIG. 11, the first input unit 110 includes a first input transistor T1, a gate of the first input transistor T1 is connected to a cascade signal input terminal STV, and a first electrode of the first input transistor T1 is connected to the first power supply voltage terminal VGH. The first power supply voltage terminal VGH provides a turn-on voltage, and a second electrode of the first input transistor T1 is connected to the first node Q1. When the turn-on voltage provided by the cascade signal input terminal STV turns on the first input transistor T1, the turn-on voltage provided by the first power supply voltage terminal VGH is transmitted to the first node Q1. The turn-on voltage of the first node Q1 turns on the turn-off transistor T9, and the turn-off transistor T9 transmits the turn-on voltage provided by the first power supply voltage terminal VGH to the second electrode of the first reset transistor T7, thereby turning off the first reset transistor T7 more thoroughly, and reducing the leakage through the first reset transistor T7.

Exemplarily, referring to FIG. 11, the second input unit 120 includes a second input transistor T2, and a gate of the second input transistor T2 is connected to the third clock signal terminal CK3. A first electrode of the second input transistor T2 is connected to the first power supply voltage terminal VGH, and a second electrode of the second input transistor T2 is connected to the third node QB. During the period when the third clock signal terminal CK3 provides the turn-on voltage, the second input transistor T2 is turned on, and the second input transistor T2 transmits the turn-on voltage provided by the first power supply voltage terminal VGH to the third node QB.

Exemplarily, referring to FIG. 1 and FIG. 11, the second output signal terminal CR of the current stage shift register 100 is connected to the cascade signal input terminal STV of the next stage shift register 100.

Exemplarily, referring to FIG. 1 and FIG. 8, the first output signal terminal OUT of the current stage shift register 100 is connected to the cascade signal input terminal STV of the next stage shift register 100.

In one or more embodiments, referring to FIG. 1 and FIG. 11, the shift register 100 includes the second power supply voltage terminal 230 that provides a turn-off voltage. The second power supply voltage terminal 230 includes a second power supply first sub-voltage terminal VGL and a second power supply second sub-voltage terminal LVGL. The voltage provided by the second power supply first sub-voltage terminal VGL is greater than the voltage provided by the second power supply second sub-voltage terminal LVGL. The second output unit 140 includes the third output transistor T6, the gate of the third output transistor T6 is connected to the third node QB, the first electrode of the third output transistor T6 is connected to the second power supply second sub-voltage terminal LVGL, and the second electrode of the third output transistor T6 is connected to the output signal terminal 210. The shift register 100 further includes a third reset transistor T3, a gate of the third reset transistor T3 is connected to the first node Q1, a first electrode of the third reset transistor T3 is connected to the third node QB, and a second electrode of the third reset transistor T3 is connected to the second power supply second sub-voltage terminal LVGL.

Exemplarily, referring to FIG. 11, the second electrode of the third output transistor T6 is connected to the second output signal terminal CR. The second output unit 140 further includes a fourth output transistor T11. A gate of the fourth output transistor T11 is connected to the third node QB, a first electrode of the fourth output transistor T11 is connected to the second power supply first sub-voltage terminal VGL, and a second electrode of the fourth output transistor T11 is connected to the first output signal terminal OUT. When the first node Q1 is at a positive voltage, the third reset transistor T3 is turned on, and the voltage provided by the second power supply second sub-voltage terminal LVGL is transmitted to the third node QB through the third reset transistor T3. When the voltage of the first output signal terminal OUT is a high level, the gate-source voltage difference of the fourth output transistor T11 is a negative value. Thus, even if the threshold voltage of the fourth output transistor T11 is negatively drifted, the fourth output transistor T11 can be turned off, thereby improving the working stability of the shift register 100. As an example, the voltage provided by the second power supply first sub-voltage terminal VGL may be −8 V, and the voltage provided by the second power supply second sub-voltage terminal LVGL may be −10 V.

Exemplarily, referring to FIG. 11, the low level of the second clock first sub-signal terminal CK2 is equal to the voltage provided by the second power supply second sub-voltage terminal LVGL, and the voltage of the second clock second sub-signal terminal BCK2 at the low level is equal to the voltage provided by the second power supply first sub-voltage terminal VGL. Thus, the low level transmitted to the second output signal terminal CR through the first output transistor T5 is equal to the low level transmitted to the second output signal terminal CR through the third output transistor T6, and the low level transmitted to the first output signal terminal OUT through the second output transistor T10 is equal to the low level transmitted to the first output signal terminal OUT through the fourth output transistor T11, which not only reduces the competition risk caused by the voltage difference, but also reduces the leakage of the two circuit branches. The two circuit branches include: one circuit branch consisting of the second clock first sub-signal terminal CK2, the first output transistor T5, the third output transistor T6, and the second power supply second sub-voltage terminal LVGL; and the other circuit branch consisting of the second clock second sub-signal terminal BCK2, the second output transistor T10, the fourth output transistor T11, and the second power supply first sub-voltage terminal VGL.

Figure 12:
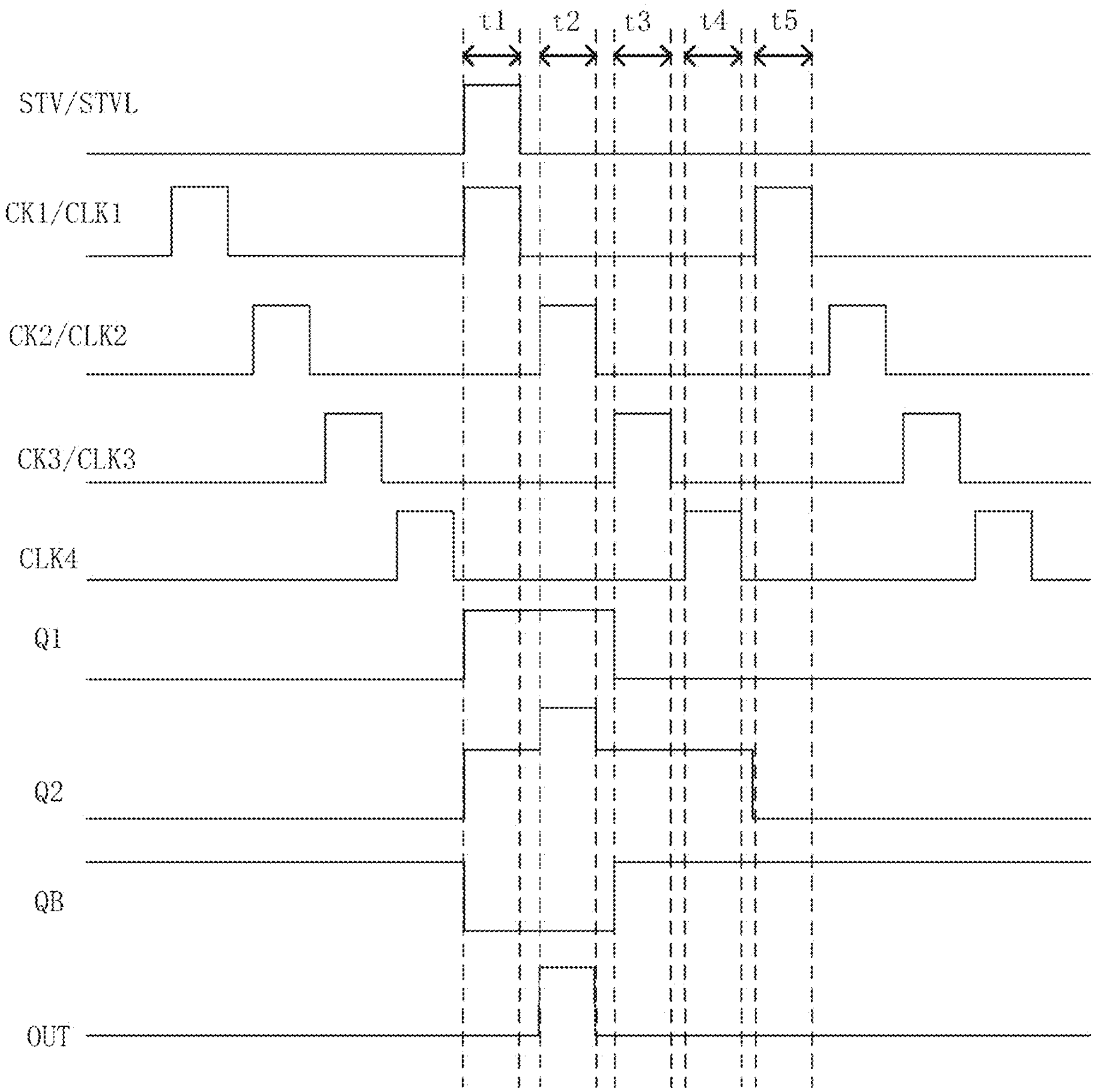
FIG. 12 is a driving timing diagram of a shift register provided in an embodiment of the present disclosure.

FIG. 12 is a driving timing diagram of a shift register provided in an embodiment of the present disclosure. Referring to FIG. 11 and FIG. 12, in a first period t1, the voltage of the cascade signal input terminal STV is a high level, the first input transistor T1 is turned on, and the first node Q1 becomes a high level. The voltage of the first clock signal terminal CK1 is a high level, the isolation transistor T4 is turned on, and the second node Q2 becomes at a high level. When the first node Q1 is at a high level, the turn-off transistor T9 is turned on, the high level of the first power supply voltage terminal VGH is transmitted to the second electrode of the first reset transistor T7, and the first reset transistor T7 is turned off more thoroughly, thereby reducing the leakage through the first reset transistor T7. When the first node Q1 is at a high level, the second capacitor C2 is charged. The second capacitor C2 maintains the high potential of the first node Q1. When the first node Q1 is at a high level, the third reset transistor T3 is turned on, the low level of the second power supply second sub-voltage terminal LVGL is transmitted to the third node QB, and the third node QB becomes at a low level. The third node QB is at a low level, and the third output transistor T6, the second reset transistor T8 and the fourth output transistor T11 are turned off. When the second node Q2 is at a high level, the first output transistor T5 and the second output transistor T10 are turned on. The second clock first sub-signal terminal CK2 is at a low level, and the second output signal terminal CR is at a low level. The second clock second sub-signal terminal BCK2 is at a low level, and the first output signal terminal OUT is at a low level. The third clock signal terminal CK3 is at a low level, and the second input transistor T2 and the first reset transistor T7 are turned off.

In a second period t2, the voltage of the cascade signal input terminal STV is a low level, and the first input transistor T1 is turned off. The first node Q1 is maintained at the high level. When the first node Q1 is at the high level, the turn-off transistor T9 is turned on, the high level of the first power supply voltage terminal VGH is transmitted to the second electrode of the first reset transistor T7, and the first reset transistor T7 is turned off more thoroughly, thereby reducing the leakage through the first reset transistor T7. When the first node Q1 is at a high level, the third reset transistor T3 is turned on, the low level of the second power supply second sub-voltage terminal LVGL is transmitted to the third node QB, and the third node QB becomes at a low level. The third node QB is at the low level, and the third output transistor T6, the second reset transistor T8 and the fourth output transistor T11 are turned off. The voltage of the first clock signal terminal CK1 is a low level, the isolation transistor T4 is turned off, and the second node Q2 is maintained at the high level. When the second node Q2 is at a high level, the first output transistor T5 is turned on, the second clock first sub-signal terminal CK2 becomes at a high level, and the second output signal terminal CR is at a high level. The second output transistor T10 is turned on, the second clock second sub-signal terminal BCK2 is at a high level, and the first output signal terminal OUT is at a high level. In the second period t2, the shift register 100 outputs an enable voltage. Due to the bootstrap effect of the first capacitor C1, the voltage of the second node Q2 is coupled to a higher potential by the first capacitor C1. The higher the gate voltages of the first output transistor T5 and the second output transistor T10, the more thoroughly the first output transistor T5 and the second output transistor T10 are turned on, and the stronger the voltage transmission capabilities of the first output transistor T5 and the second output transistor T10 become, thereby improving the driving capability of the enable voltage output by the first output signal terminal OUT and the second output signal terminal CR. The third clock signal terminal CK3 is at a low level, the second input transistor T2 and the first reset transistor T7 are turned off.

In the first period t1 and the second period t2, the high level of the first power supply voltage terminal VGH is transmitted to the second electrode of the first reset transistor T7, to turn off the first reset transistor T7 more thoroughly.

In a third period t3, the voltage of the cascade signal input terminal STV is a low level, and the first input transistor T1 is turned off. The voltage of the first clock signal terminal CK1 is a low level, and the isolation transistor T4 is turned off. The third clock signal terminal CK3 becomes at a high level, the second input transistor T2 is turned on, and the third node QB becomes at a high level. When the third clock signal terminal CK3 and the third node QB are at the high level, the first reset transistor T7 and the second reset transistor T8 are turned on, the low level of the second power supply second sub-voltage terminal LVGL is transmitted to the first node Q1, and the first node Q1 becomes at a low level. When the first node Q1 is at a low level, the third reset transistor T3 and the turn-off transistor T9 are turned off. When the second node Q2 is at a high level, the first output transistor T5 and the second output transistor T10 are turned on. The second clock first sub-signal terminal CK2 is at a low level, the low level of the second clock first sub-signal terminal CK2 is transmitted to the second output signal terminal CR through the first output transistor T5, and the second output signal terminal CR is a low level. The second clock second sub-signal terminal BCK2 is at a low level, the low level of the second clock second sub-signal terminal BCK2 is transmitted to the first output signal terminal OUT through the second output transistor T10, and the first output signal terminal OUT is at a low level. When the third node QB is at a high level, the third output transistor T6 and the fourth output transistor T11 are turned on, the low level of the second power supply second sub-voltage terminal LVGL is transmitted to the second output signal terminal CR through the third output transistor T6, and the voltage of the second power supply second sub-voltage terminal LVGL is equal to the low level of the second clock first sub-signal terminal CK2. The low level of the second power supply first sub-voltage terminal VGL is transmitted to the first output signal terminal OUT through the fourth output transistor T11, and the voltage of the second power supply first sub-voltage terminal VGL is equal to the low level of the second clock second sub-signal terminal BCK2, which not only reduces the competition risk caused by the voltage difference, but also reduces the leakage of the two circuit branches. The two circuit branches include: one circuit branch consisting of the second clock first sub-signal terminal CK2, the first output transistor T5, the third output transistor T6, and the second power supply second sub-voltage terminal LVGL; and the other circuit branch consisting of the second clock second sub-signal terminal BCK2, the second output transistor T10, the fourth output transistor T11, and the second power supply first sub-voltage terminal VGL. In the third period t3, when the voltage of the first output signal terminal OUT is a high level, the gate-source voltage difference of the fourth output transistor T11 is a negative value. Thus, even if the threshold voltage of the fourth output transistor T11 is negatively drifted, the fourth output transistor T11 can be turned off, thereby improving the working stability of the shift register 100.

In a fourth period t4, the voltage of the cascade signal input terminal STV is a low level, and the first input transistor T1 is turned off. The first node Q1 is maintained at the low level. The voltage of the first clock signal terminal CK1 is a low level, and the isolation transistor T4 is turned off. The second node Q2 is maintained at the high level, and the first output transistor T5 and the second output transistor T10 are turned on. The low level of the second clock first sub-signal terminal CK2 is transmitted to the second output signal terminal CR through the first output transistor T5, and the second output signal terminal CR is at a low level. The low level of the second clock second sub-signal terminal BCK2 is transmitted to the first output signal terminal OUT through the second output transistor T10, and the first output signal terminal OUT is a low level. The third node QB is maintained at the high level, the third output transistor T6 and the fourth output transistor T11 are turned on, the low level of the second power supply second sub-voltage terminal LVGL is transmitted to the second output signal terminal CR through the third output transistor T6, and the low level of the second power supply first sub-voltage terminal VGL is transmitted to the first output signal terminal OUT through the fourth output transistor T11.

In a fifth period t5, the voltage of the cascade signal input terminal STV is a low level, the first input transistor T1 is turned off, and the first node Q1 is maintained at the low level. The voltage of the first clock signal terminal CK1 is a high level, the isolation transistor T4 is turned on, the voltage of the second node Q2 is pulled down by the low level of the first node Q1, and the second node Q2 becomes at a low level. When the first node Q1 is at a low level, the turn-off transistor T9 is turned off. When the second node Q2 is at a low level, the first output transistor T5 and the second output transistor T10 are turned off, that is, waiting until the next high level of the first clock signal terminal CK1 to reset the potential of the second node Q2 to a high level. When the first node Q1 is at a low level, the third reset transistor T3 is turned off. The third node QB is maintained at the high level, the third output transistor T6 and the fourth output transistor T11 are turned on, the low level of the second power supply second sub-voltage terminal LVGL is transmitted to the second output signal terminal CR through the third output transistor T6, and the low level of the second power supply first sub-voltage terminal VGL is transmitted to the first output signal terminal OUT through the fourth output transistor T11.

Figure 13:
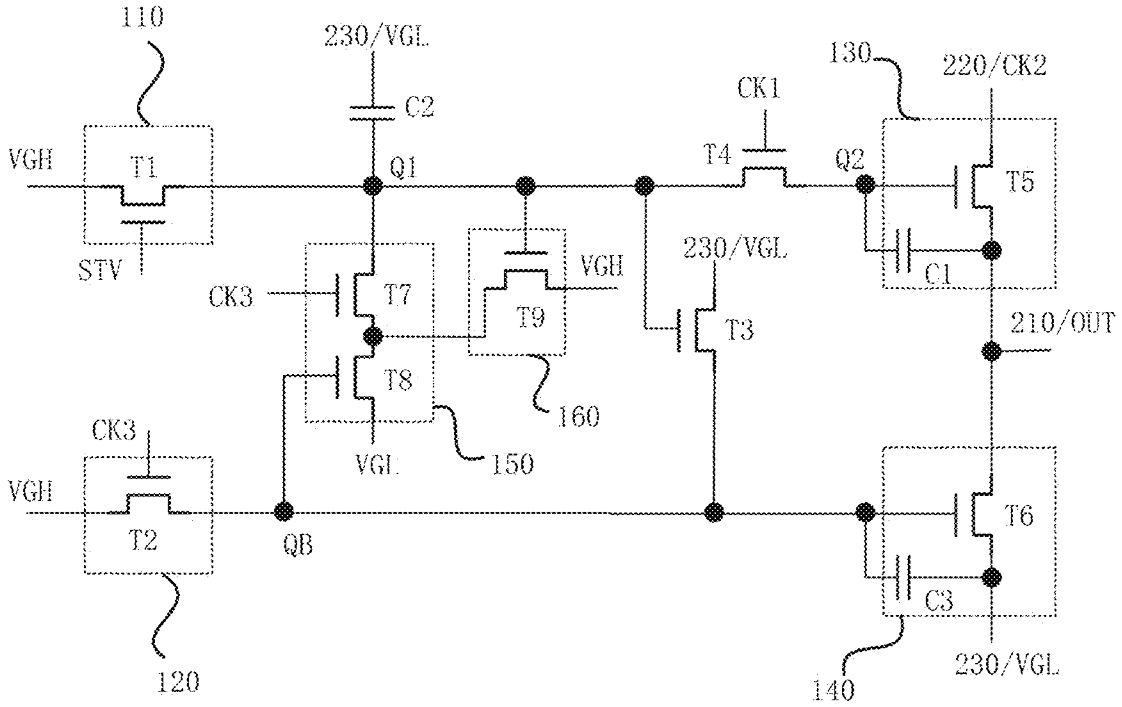
FIG. 13 is another circuit diagram of a shift register provided in an embodiment of the present disclosure.

FIG. 13 is another circuit diagram of a shift register provided in an embodiment of the present disclosure. Referring to FIG. 13, the first output signal terminal OUT of the current stage shift register 100 is connected to the cascade signal input terminal STV of the next stage shift register 100. The circuit of the shift register shown in FIG. 13 applies to the driving timing shown in FIG. 12.

Figure 14:
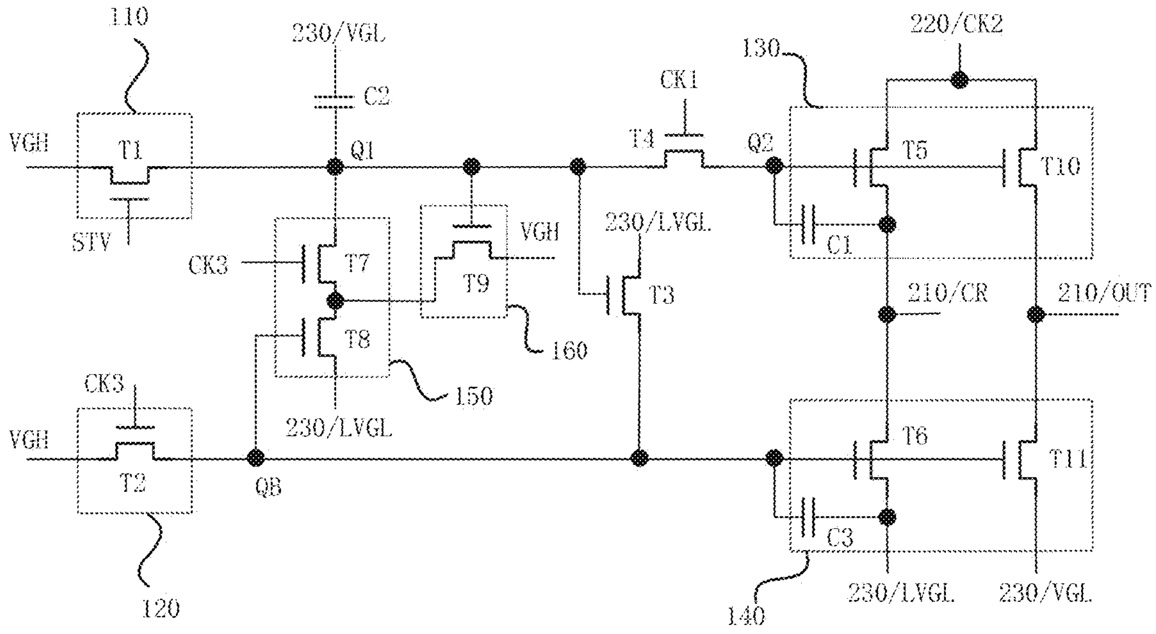
FIG. 14 is another circuit diagram of a shift register provided in an embodiment of the present disclosure.

FIG. 14 is another circuit diagram of a shift register provided in an embodiment of the present disclosure. Referring to FIG. 14, the first electrode of the first output transistor T5 is connected to the second clock first sub-signal terminal CK2, and the first electrode of the second output transistor T10 is connected to the second clock first sub-signal terminal CK2. The circuit of the shift register shown in FIG. 14 applies to the driving timing shown in FIG. 12.

Figure 15:
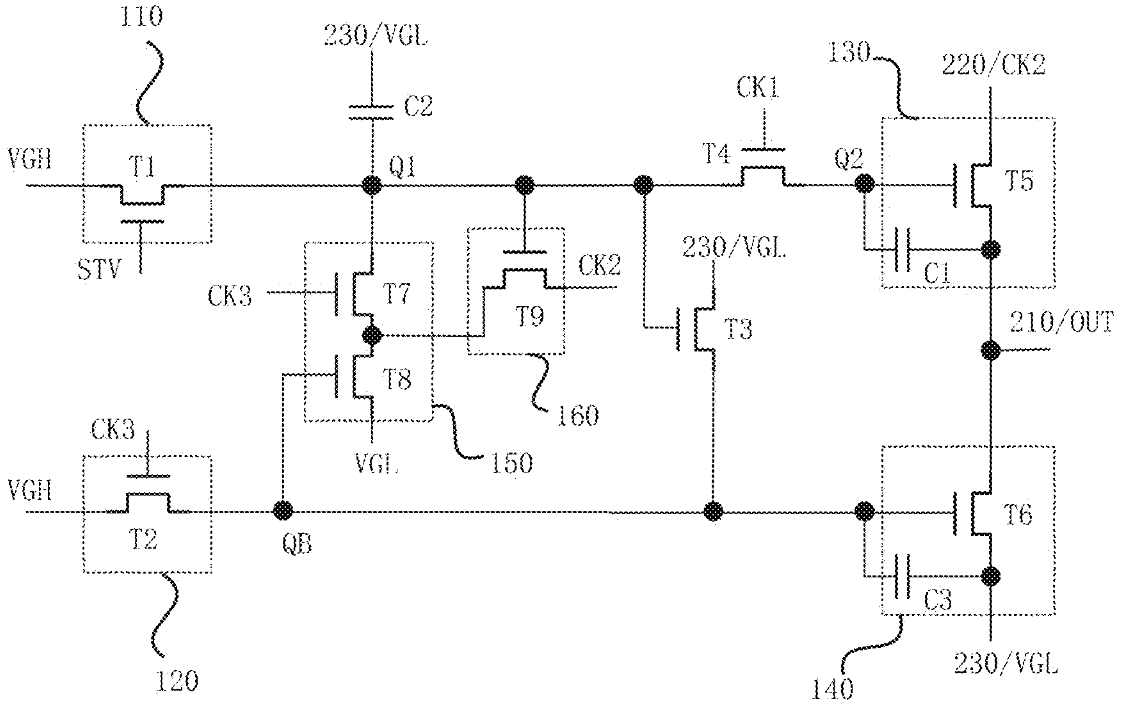
FIG. 15 is another circuit diagram of a shift register provided in an embodiment of the present disclosure.

FIG. 15 is another circuit diagram of a shift register provided in an embodiment of the present disclosure. Referring to FIG. 15, the second electrode of the turn-off transistor T9 is connected to the second clock signal terminal 220. The circuit of the shift register shown in FIG. 15 applies to the driving timing shown in FIG. 12. Referring to FIG. 12 and FIG. 15, in the second period t2, the clock signal provided by the second clock signal terminal 220 is a high level, the turn-off transistor T9 is turned on, and transmits the high level of the second clock first sub-signal terminal CK2 to the second electrode of the first reset transistor T7; thus, the first reset transistor T7 is turned off more thoroughly, and the leakage through the first reset transistor T7 is reduced. It should be noted that in the second period t2, the voltage of the second node Q2 is coupled and pulled up, which is more likely to cause leakage. Therefore, in the second period t2, the first reset transistor T7 is turned off more thoroughly, which can more significantly reduce the leakage of the shift register and the leakage of the gate driving circuit.

Figure 16:
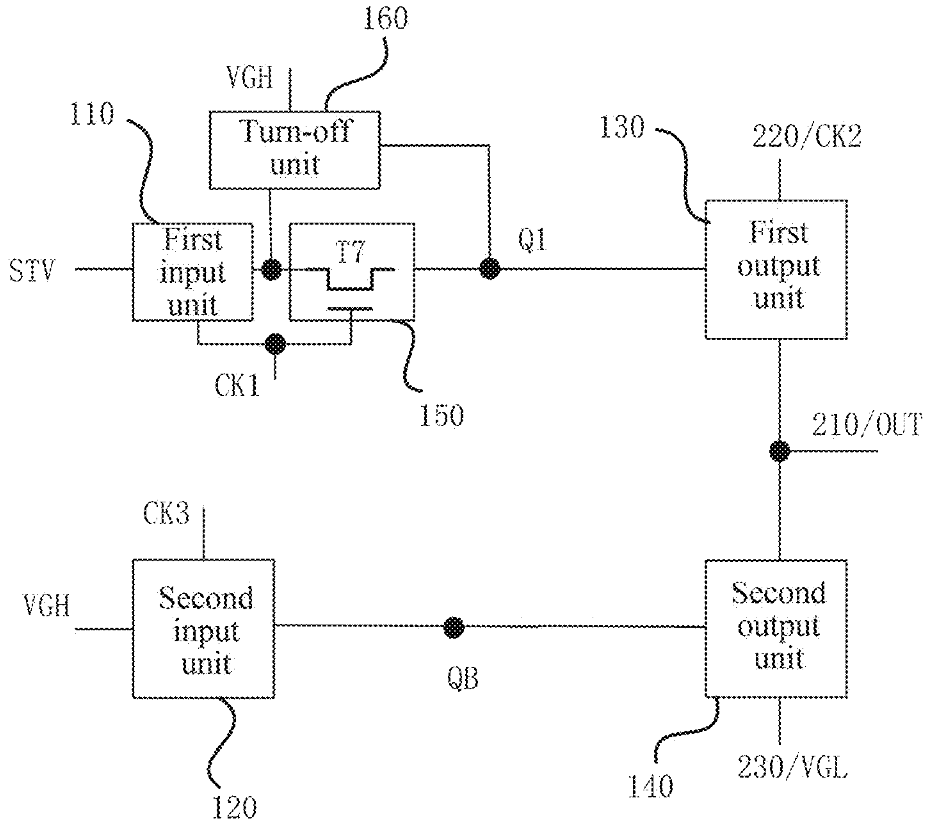
FIG. 16 is another circuit diagram of a shift register provided in an embodiment of the present disclosure.

FIG. 16 is another circuit diagram of a shift register provided in an embodiment of the present disclosure. Referring to FIG. 16, the gate of the first reset transistor T7 is connected to the first clock signal terminal CK1, and the second electrode of the first reset transistor T7 is connected to the output terminal of the first input unit 110. When the voltage of the first node Q1 is the turn-on voltage, the turn-off unit 160 is turned on, and writes the turn-on voltage into the second electrode of the first reset transistor T7. The first electrode of the first reset transistor T7 and the second electrode of the first reset transistor T7 are both at the turn-on voltage. The gate of the first reset transistor T7 is at a turn-off voltage, in this way, the turn-on voltage applied to the second electrode of the first reset transistor T7 turns off the first reset transistor T7 more thoroughly, thereby reducing the leakage through the first reset transistor T7, and reducing the leakage of the circuit branch where the first node Q1 and the first reset unit 150 are located.

Figure 17:
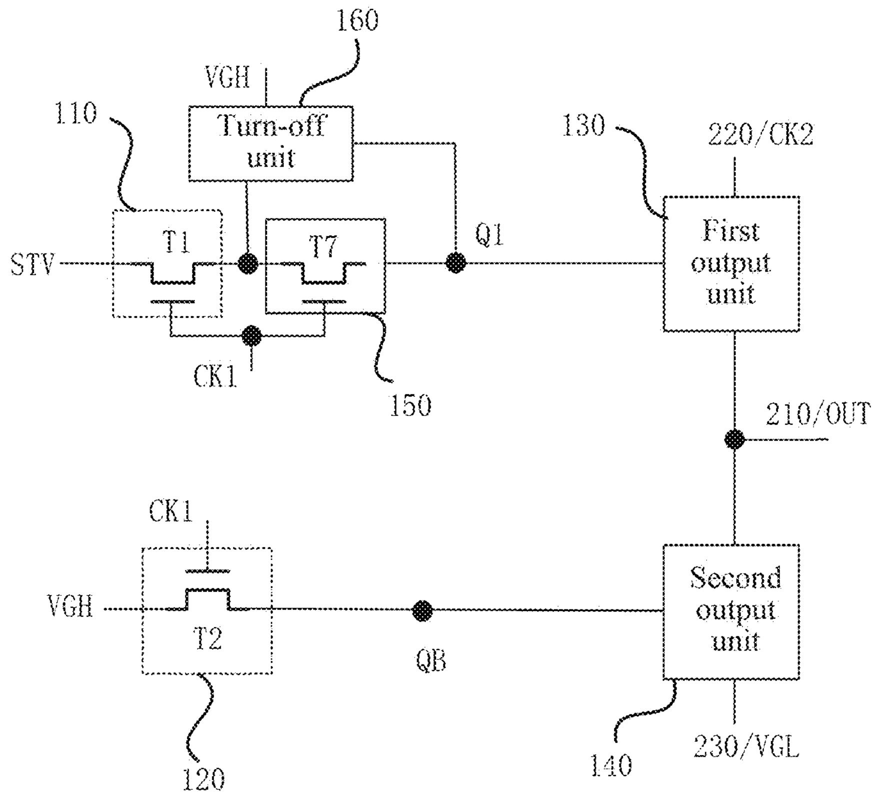
FIG. 17 is another circuit diagram of a shift register provided in an embodiment of the present disclosure.

FIG. 17 is another circuit diagram of a shift register provided in an embodiment of the present disclosure. Referring to FIG. 17, the first input unit 110 includes a first input transistor T1. The gate of the first input transistor T1 is connected to the first clock signal terminal CK1, a first electrode of the first input transistor T1 is connected to the cascade signal input terminal STV, and a second electrode of the first input transistor T1 is connected to the second electrode of the first reset transistor T7. When the first input transistor T1 is turned on by the turn-on voltage provided by the first clock signal terminal CK1, the voltage of the cascade signal input terminal STV is transmitted to the second electrode of the first reset transistor T7, and when the first reset unit 150 is also turned on, the voltage of the cascade signal input terminal STV is transmitted to the first node Q1.

Exemplarily, referring to FIG. 17, the second input unit 120 includes a second input transistor T2, the gate of the second input transistor T2 is connected to the first clock signal terminal CK1. A first electrode of the second input transistor T2 is connected to the first power supply voltage terminal VGH, and a second electrode of the second input transistor T2 is connected to the third node QB. During the period when the first clock signal terminal CK1 provides the turn-on voltage, the second input transistor T2 is turned on, and the second input transistor T2 transmits the turn-on voltage provided by the first power supply voltage terminal VGH to the third node QB.

Figure 18:
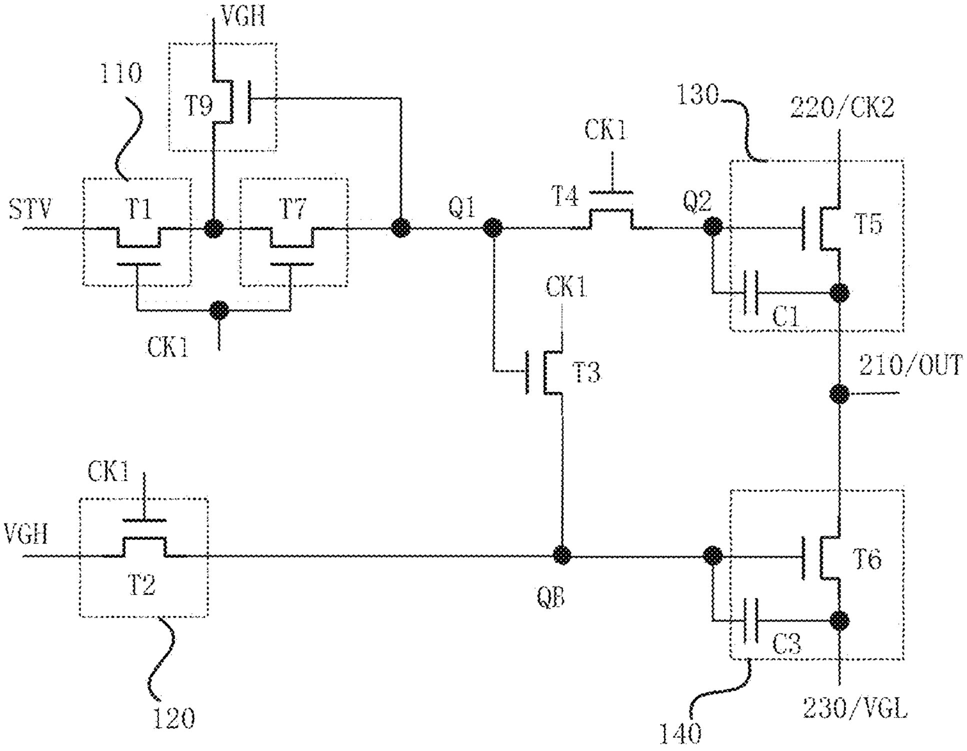
FIG. 18 is another circuit diagram of a shift register provided in an embodiment of the present disclosure.

FIG. 18 is another circuit diagram of a shift register provided in an embodiment of the present disclosure. Referring to FIG. 18, the turn-off unit 160 includes a turn-off transistor T9. The gate of the turn-off transistor T9 is connected to the first node Q1, and a first electrode of the turn-off transistor T9 is connected to the second electrode of the first reset transistor T7. When being turned on, the turn-off transistor T9 writes the turn-on voltage into the second electrode of the first reset transistor T7, and the first reset transistor T7 is turned off more thoroughly.

For example, referring to FIG. 18, the first electrode of the first reset transistor T7 is connected to the first node Q1. When the turn-on voltage provided by the first clock signal terminal CK1 turns on the first input transistor T1 and the first reset transistor T7, the voltage of the cascade signal input terminal STV is transmitted to the first node Q1 through the first input transistor T1 and the first reset transistor T7. The second electrode of the third reset transistor T3 is connected to the first clock signal terminal CK1.

Figure 19:
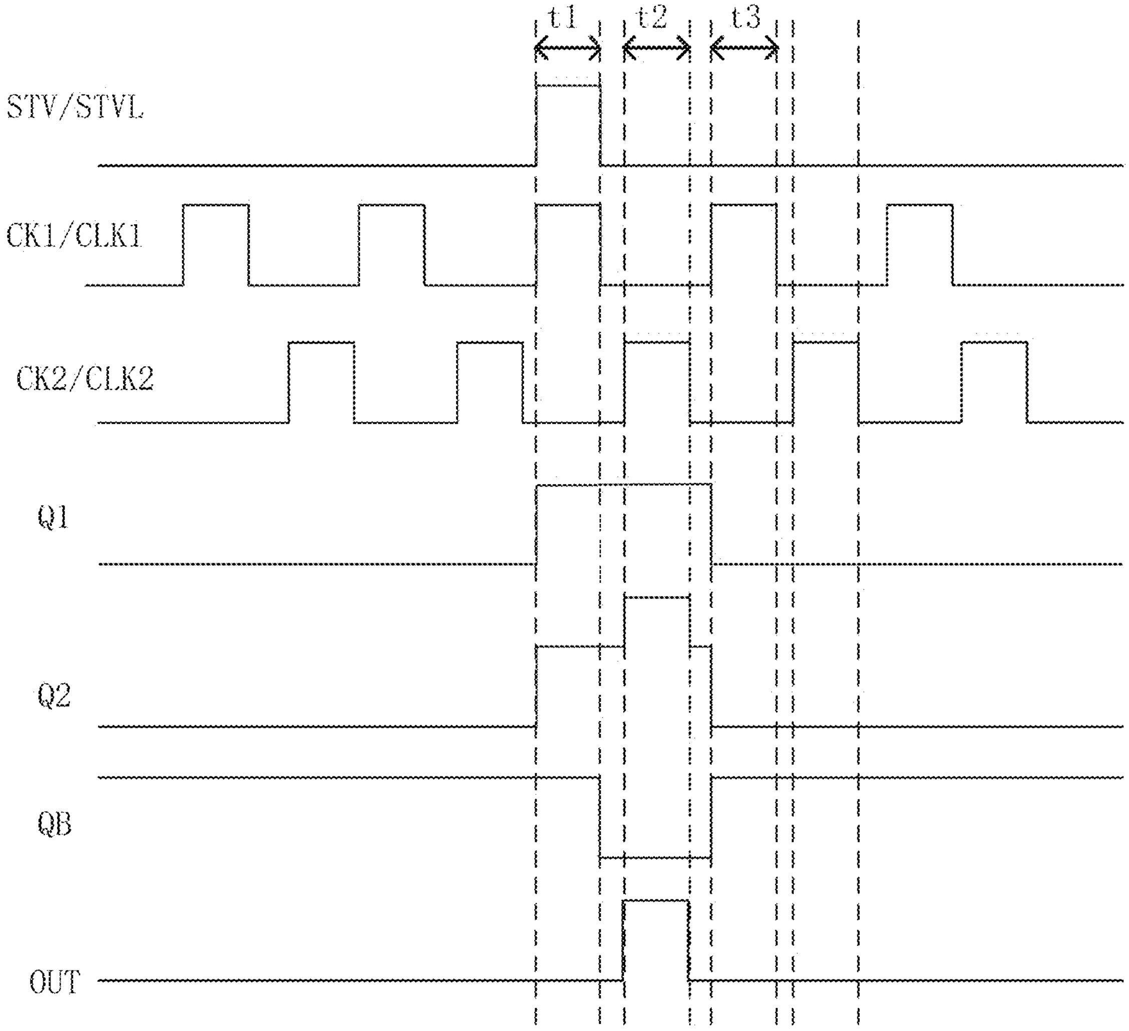
FIG. 19 is another driving timing diagram of a shift register provided in an embodiment of the present disclosure.

FIG. 19 is another driving timing diagram of a shift register provided in an embodiment of the present disclosure. Referring to FIG. 18 and FIG. 19, in a first period t1, the voltage of the first clock signal terminal CK1 is a high level, and the first input transistor T1 and the first reset transistor T7 are turned on. The voltage of the cascade signal input terminal STV is a high level, and the high level of the cascade signal input terminal STV is transmitted to the first node Q1. When the first node Q1 is a high level, the third reset transistor T3 is turned on, and the high level of the first clock signal terminal CK1 is transmitted to the third node QB. The first clock signal terminal CK1 is a high level, the second input transistor T2 is turned on, the high level of the first power supply voltage terminal VGH is transmitted to the third node QB through the second input transistor T2, and the third node QB becomes at a high level. When the first node Q1 is at a high level, the first output transistor T5 is turned on, and the low level of the second clock first sub-signal terminal CK2 is transmitted to the first output signal terminal OUT. When the third node QB is at a high level, the third output transistor T6 is turned on, and the low level of the second power supply first sub-voltage terminal VGL is transmitted to the first output signal terminal OUT. The first output signal terminal OUT is at a low level.

In a second period t2, the voltage of the first clock signal terminal CK1 is a low level, and the first input transistor T1, the second input transistor T2 and the first reset transistor T7 are turned off. The first node Q1 is maintained at the high level, the third reset transistor T3 is turned on, and the low level of the first clock signal terminal CK1 is transmitted to the third node QB. The third node QB becomes at a low level. The third output transistor T6 is turned off. The second node Q2 is maintained at the high level, the first output transistor T5 is turned on, the second clock signal terminal 220 becomes at a high level, the high level of the second clock signal terminal 220 is transmitted to the first output signal terminal OUT through the first output transistor T5, and the first output signal terminal OUT is at a high level. The first node Q1 is at a high level, the turn-off transistor T9 is turned on, the high level of the first power supply voltage terminal VGH is transmitted to the second electrode of the first reset transistor T7 through the turn-off transistor T9, and the first reset transistor T7 is turned off more thoroughly, thereby reducing the leakage through the first reset transistor T7, and reducing the leakage of the circuit branch where the first node Q1, the first reset transistor T7, the first input transistor T1, and the cascade signal input terminal STV are located. The voltage of the first clock signal terminal CK1 is a low level, and the isolation transistor T4 is turned off. Due to the bootstrap effect of the first capacitor C1, the voltage of the second node Q2 is coupled to a higher potential by the first capacitor C1. The higher the gate voltage of the first output transistor T5 reaches, the more thoroughly the first output transistor T5 is turned on, and the stronger the voltage transmission capability of the first output transistor T5 is, thereby improving the driving capability of the enable voltage output by the first output signal terminal OUT.

In a third period t3, the voltage of the first clock signal terminal CK1 is a high level, and the first input transistor T1 and the first reset transistor T7 are turned on. The voltage of the cascade signal input terminal STV is a low level, and the low level of the cascade signal input terminal STV is transmitted to the first node Q1. The first node Q1 becomes at a low level. When the first node Q1 is at a low level, the third reset transistor T3 is turned off. The voltage of the first clock signal terminal CK1 is a high level, the isolation transistor T4 is turned on, the voltage of the second node Q2 is pulled down by the low level at the first node Q1, and the second node Q2 becomes at a low level. The first output transistor T5 is turned off. The voltage of the first clock signal terminal CK1 is a high level, the second input transistor T2 is turned on, the high level of the first power supply voltage terminal VGH is transmitted to the third node QB through the second input transistor T2, and the third node QB becomes at a high level. When the third node QB is at a high level, the third output transistor T6 is turned on, and the low level of the second power supply first sub-voltage terminal VGL is transmitted to the first output signal terminal OUT. The first output signal terminal OUT is at a low level.

Figure 20:
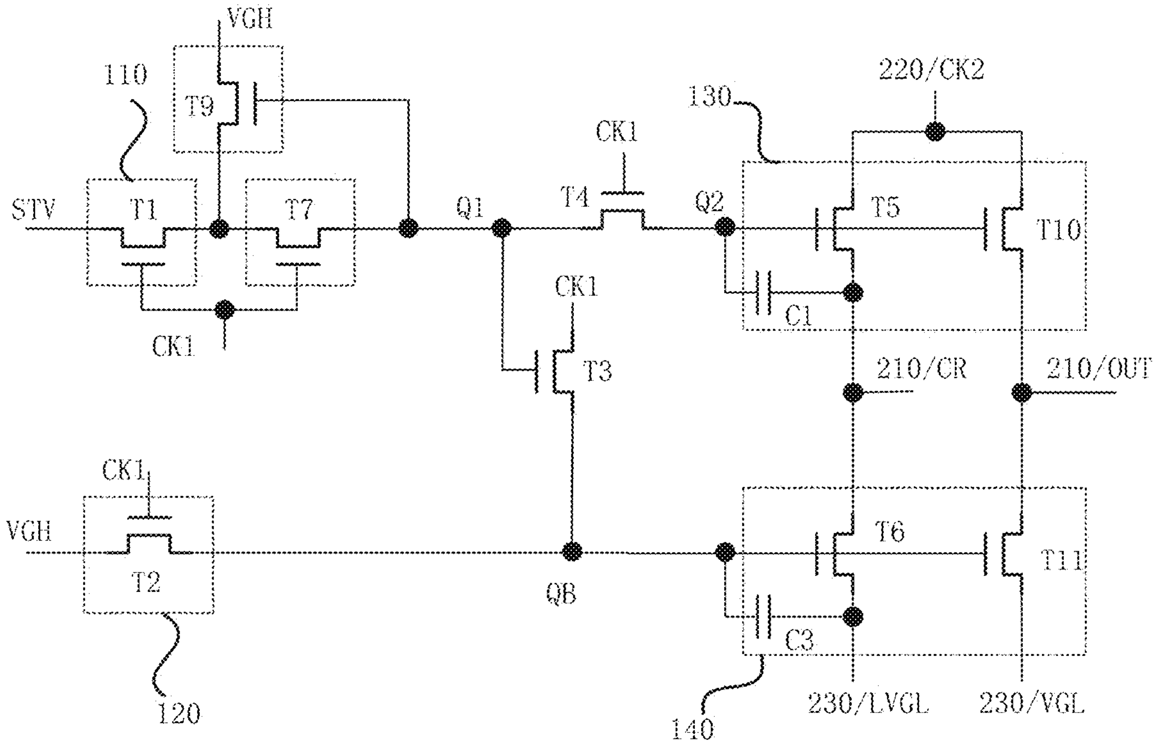
FIG. 20 is another circuit diagram of a shift register provided in an embodiment of the present disclosure.

FIG. 20 is another circuit diagram of a shift register provided in an embodiment of the present disclosure. Referring to FIG. 1 and FIG. 20, the first electrode of the first output transistor T5 is connected to the second clock first sub-signal terminal CK2, and the first electrode of the second output transistor T10 is connected to the second clock first sub-signal terminal CK2. The circuit of the shift register shown in FIG. 20 applies to the driving timing shown in FIG. 19. The second output signal terminal CR of the current stage shift register 100 is connected to the cascade signal input terminal STV of the next stage shift register 100.

Figure 21:
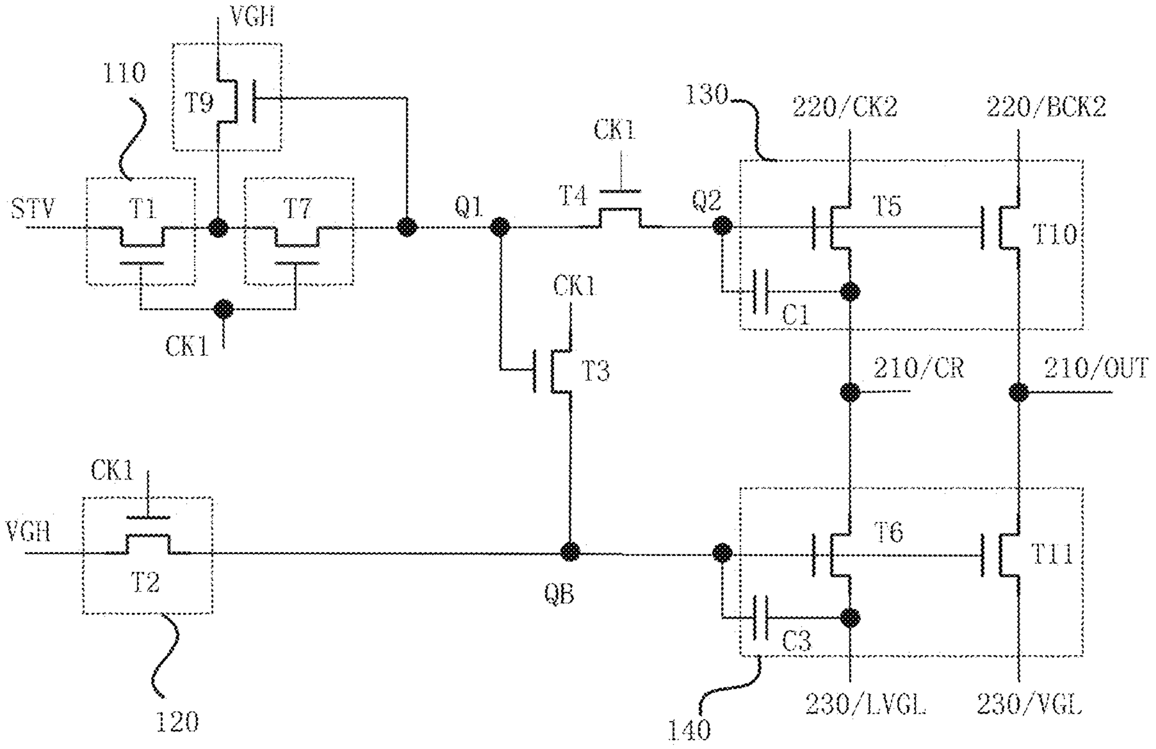
FIG. 21 is another circuit diagram of a shift register provided in an embodiment of the present disclosure.

FIG. 21 is another circuit diagram of a shift register provided in an embodiment of the present disclosure. Referring to FIG. 21, the first electrode of the first output transistor T5 is connected to the second clock first sub-signal terminal CK2, and the first electrode of the second output transistor T10 is connected to the second clock second sub-signal terminal BCK2. The circuit of the shift register shown in FIG. 21 applies to the driving timing shown in FIG. 19.

Figure 22:
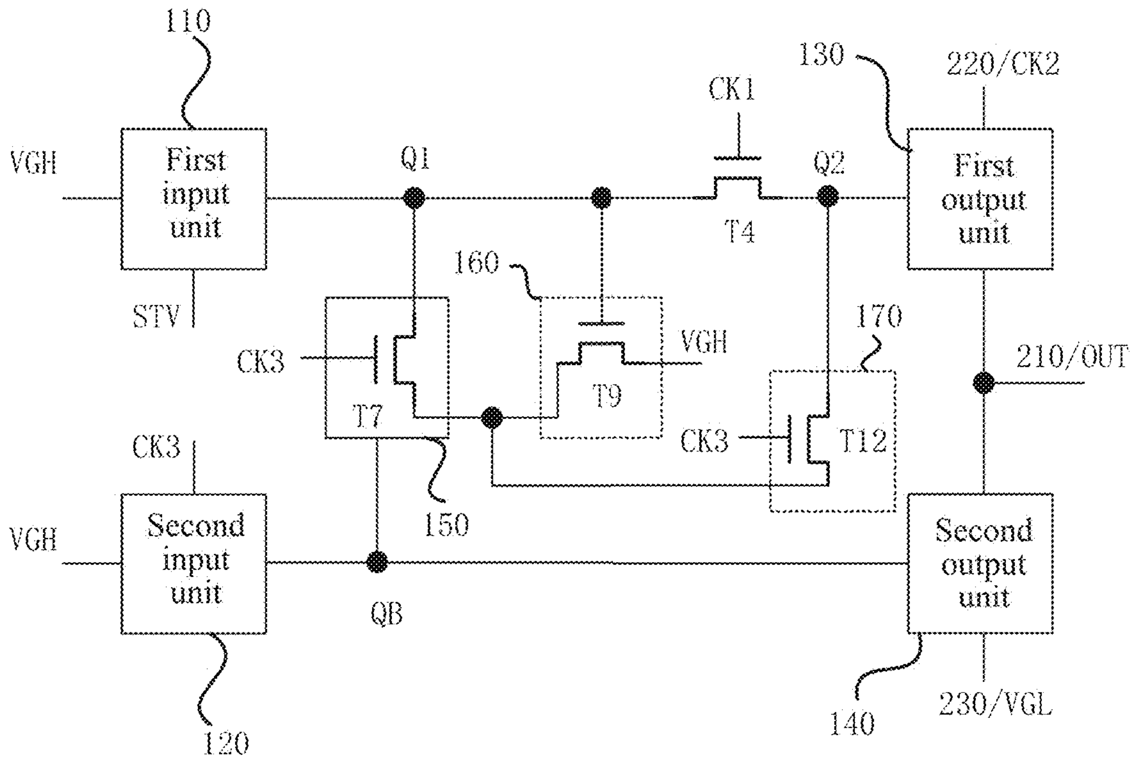
FIG. 22 is another circuit diagram of a shift register provided in an embodiment of the present disclosure.

FIG. 22 is another circuit diagram of a shift register provided in an embodiment of the present disclosure. Referring to FIG. 1 and FIG. 22, the shift register 100 further includes a second reset unit 170, and the second reset unit 170 is configured to write a turn-off voltage into the second node Q2. The second reset unit 170 includes a fourth reset transistor T12, and a gate of the fourth reset transistor T12 is connected to the third clock signal terminal CK3. A first electrode of the fourth reset transistor T12 is connected to the second node Q2. A first terminal of the turn-off unit 160 is connected to a second electrode of the fourth reset transistor T12, and is configured to write the turn-on voltage into the second electrode of the fourth reset transistor T12 when the first node Q1 controls the turn-off unit 160 to turn on. When the voltage of the first node Q1 is the turn-on voltage, the turn-off unit 160 is turned on, and writes the turn-on voltage into the second electrode of the fourth reset transistor T12. The first electrode of the fourth reset transistor T12 and the second electrode of the fourth reset transistor T12 are both turn-on voltages. The gate of the fourth reset transistor T12 is a turn-off voltage, and the turn-on voltage applied to the second electrode of the fourth reset transistor T12 turns off the fourth reset transistor T12 more thoroughly, thereby reducing the leakage through the fourth reset transistor T12, and reducing the leakage of the circuit branch where the second node Q2 and the second reset unit 170 are located. In another aspect, the second reset unit 170 is configured to write the turn-off voltage into the second node Q2, thereby resetting the second node Q2.

Figure 23:
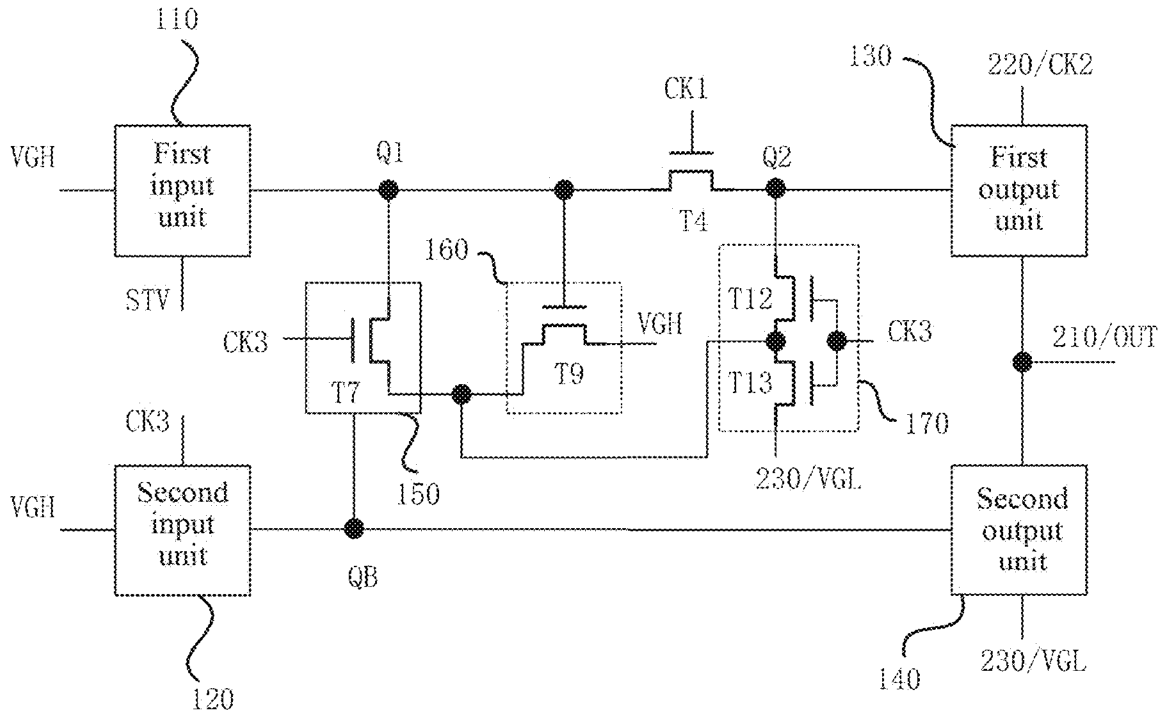
FIG. 23 is another circuit diagram of a shift register provided in an embodiment of the present disclosure.

FIG. 23 is another circuit diagram of a shift register provided in an embodiment of the present disclosure. Referring to FIG. 23, the second reset unit 170 further includes a fifth reset transistor T13. A gate of the fifth reset transistor T13 is connected to the third clock signal terminal CK3, a first electrode of the fifth reset transistor T13 is connected to the second electrode of the fourth reset transistor T12, and a second electrode of the fifth reset transistor T13 is connected to the second power supply voltage terminal 230. The second power supply voltage terminal 230 provides a turn-off voltage. The turn-on voltage applied to the second electrode of the fourth reset transistor T12 turns off the fourth reset transistor T12 more thoroughly, thereby reducing the leakage through the fourth reset transistor T12, and reducing the leakage of the circuit branch where the second node Q2, the fourth reset transistor T12, the fifth reset transistor T13, and the second power supply voltage terminal 230 are located.

For example, referring to FIG. 23, the same turn-off unit 160 not only turns off the first reset transistor T7 more thoroughly to reduce the leakage through the first reset transistor T7, but also turns off the fourth reset transistor T12 more thoroughly to reduce the leakage through the fourth reset transistor T12.

Figure 24:
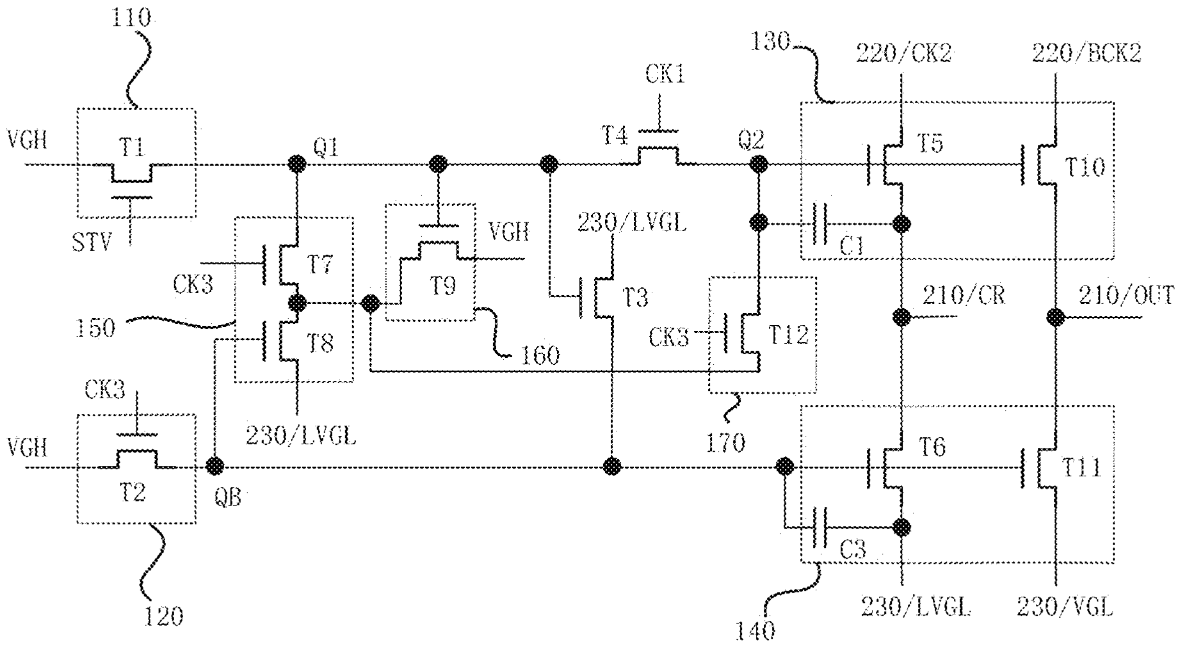
FIG. 24 is another circuit diagram of a shift register provided in an embodiment of the present disclosure.
Figure 25:
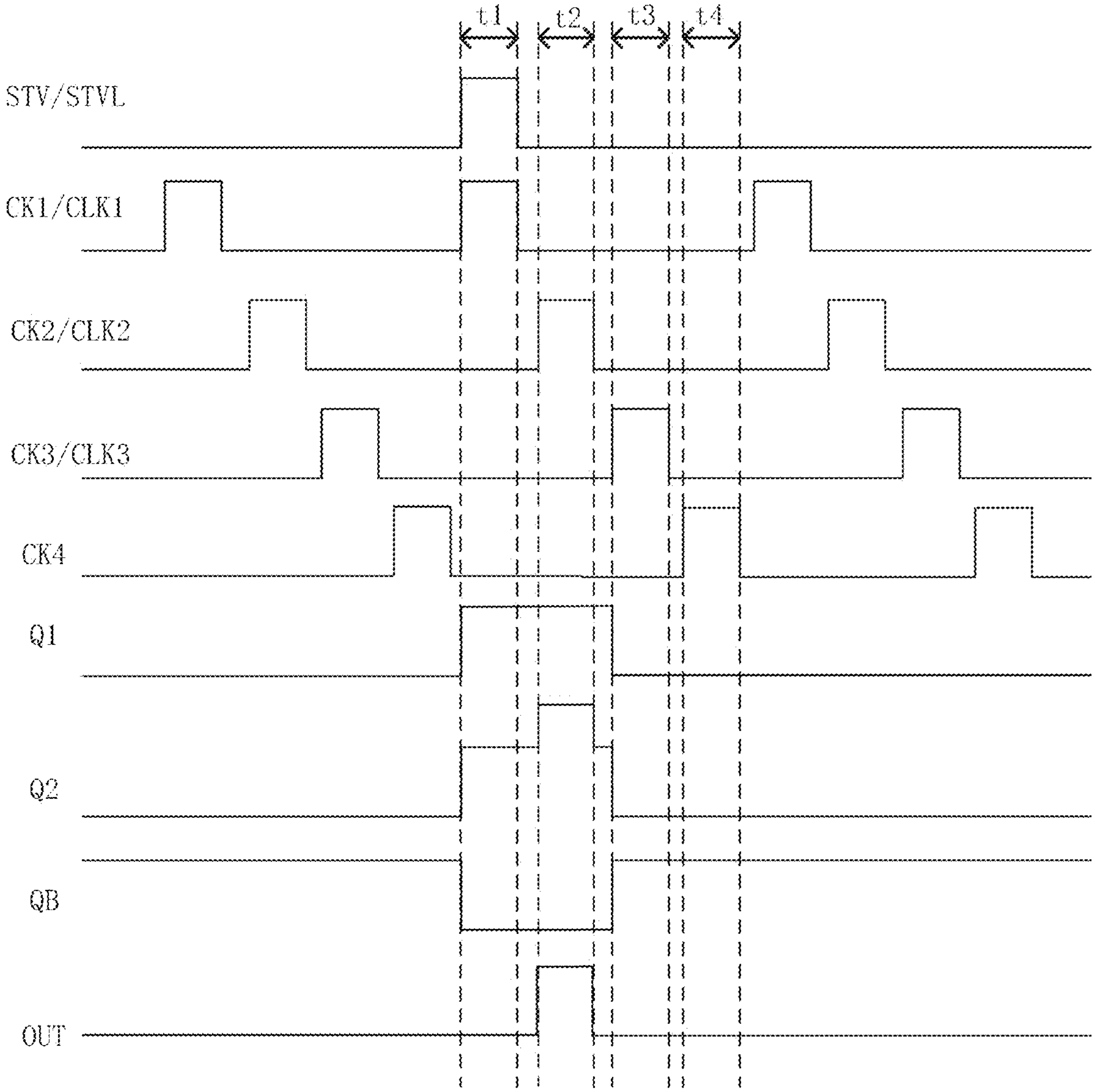
FIG. 25 is another driving timing diagram of a shift register provided in an embodiment of the present disclosure.

FIG. 24 is another circuit diagram of a shift register provided in an embodiment of the present disclosure. FIG. 25 is another driving timing diagram of a shift register provided in an embodiment of the present disclosure. The contents of the same process in FIG. 25 and FIG. 12 are not repeated here. Referring to FIG. 24 and FIG. 25, in a first period t1, the first node Q1 becomes at a high level, and the second node Q2 becomes at a high level. When the first node Q1 is a high level, the turn-off transistor T9 is turned on, and transmits the high level to the second electrode of the first reset transistor T7, and the first reset transistor T7 is turned off more thoroughly. The third clock signal terminal CK3 is a low level, the fourth reset transistor T12 is turned off. The turn-off transistor T9 is turned on, and transmits the high level to the second electrode of the fourth reset transistor T12, the fourth reset transistor T12 is turned off more thoroughly.

In a second period t2, the first node Q1 is maintained at the high level. When the first node Q1 is at a high level, the turn-off transistor T9 transmits the high level to the second electrode of the first reset transistor T7, and the first reset transistor T7 is turned off more thoroughly. The third clock signal terminal CK3 is a low level, and the fourth reset transistor T12 is turned off. The turn-off transistor T9 is turned on, and transmits the high level to the second electrode of the fourth reset transistor T12, and the fourth reset transistor T12 is turned off more thoroughly.

In a third period t3, the first clock signal terminal CK1 is at a low level, and the isolation transistor T4 is turned off. The third clock signal terminal CK3 is at a high level, the second input transistor T2 is turned on, and the third node QB becomes at a high level. When the third clock signal terminal CK3 and the third node QB are at the high level, the first reset transistor T7 and the second reset transistor T8 are turned on, the low level of the second power supply second sub-voltage terminal LVGL is transmitted to the first node Q1, and the first node Q1 becomes at a low level. When the first node Q1 is at a low level, the third reset transistor T3 and the turn-off transistor T9 are turned off. The third clock signal terminal CK3 is at a high level, the fourth reset transistor T12 is turned on, and the low level of the second power supply second sub-voltage terminal LVGL is transmitted to the second node Q2 through the second reset transistor T8 and the fourth reset transistor T12, and the second node Q2 is pulled down from a high level to a low level; thus, achieving the reset of the second node Q2. In the third period t3, the second node Q2 is at a low level, and the first output transistor T5 and the second output transistor T10 are turned off. The third node QB is at a high level, the third output transistor T6 and the fourth output transistor T11 are turned on, the low level of the second power supply second sub-voltage terminal LVGL is transmitted to the second output signal terminal CR through the third output transistor T6, and the low level of the second power supply first sub-voltage terminal VGL is transmitted to the first output signal terminal OUT through the fourth output transistor T11.

Figure 26:
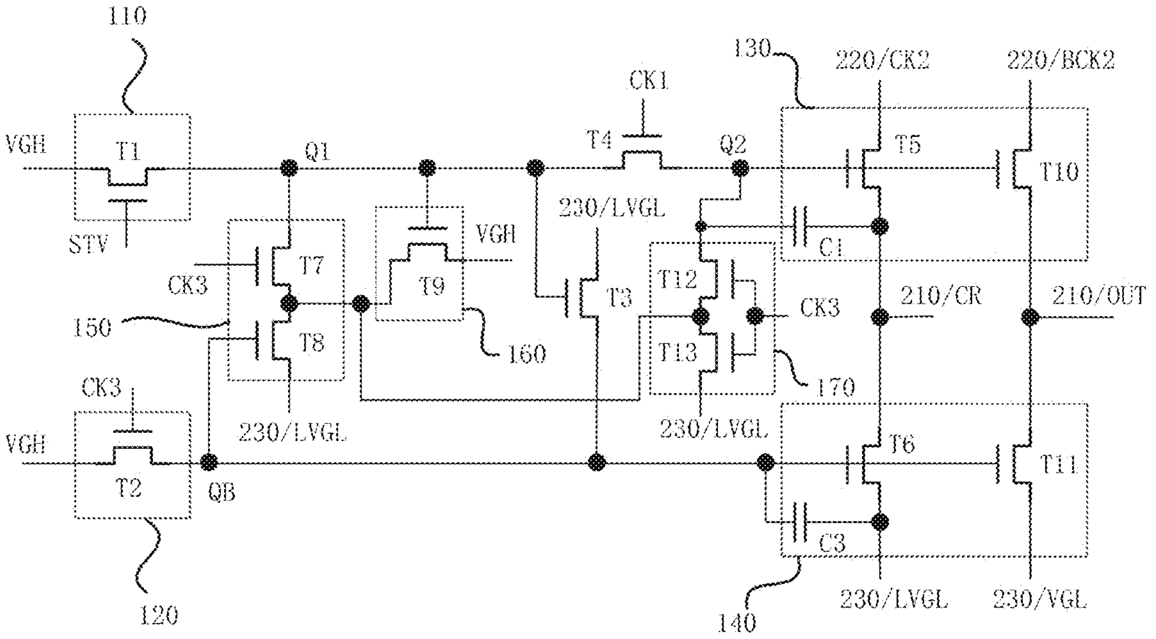
FIG. 26 is another circuit diagram of a shift register provided in an embodiment of the present disclosure.

FIG. 26 is another circuit diagram of a shift register provided in an embodiment of the present disclosure. The circuit of the shift register shown in FIG. 26 applies to the driving timing shown in FIG. 25. Referring to FIG. 25 and FIG. 26, the second reset unit 170 further includes a fifth reset transistor T13. The gate of the fifth reset transistor T13 is connected to the third clock signal terminal CK3, a first electrode of the fifth reset transistor T13 is connected to the second electrode of the fourth reset transistor T12, and a second electrode of the fifth reset transistor T13 is connected to the second power supply second sub-voltage terminal LVGL. In the third period t3, the third node QB is at a high level, and the second reset transistor T8 is turned on. The third clock signal terminal CK3 is at a high level, the fourth reset transistor T12 and the fifth reset transistor T13 are turned on. The low level of the second power supply second sub-voltage terminal LVGL is transmitted to the first node Q1 through the second reset transistor T8 and the first reset transistor T7, and the low level of the second power supply second sub-voltage terminal LVGL is transmitted to the second node Q2 through the fifth reset transistor T13 and the fourth reset transistor T12, to reset the second node Q2.

Figure 27:
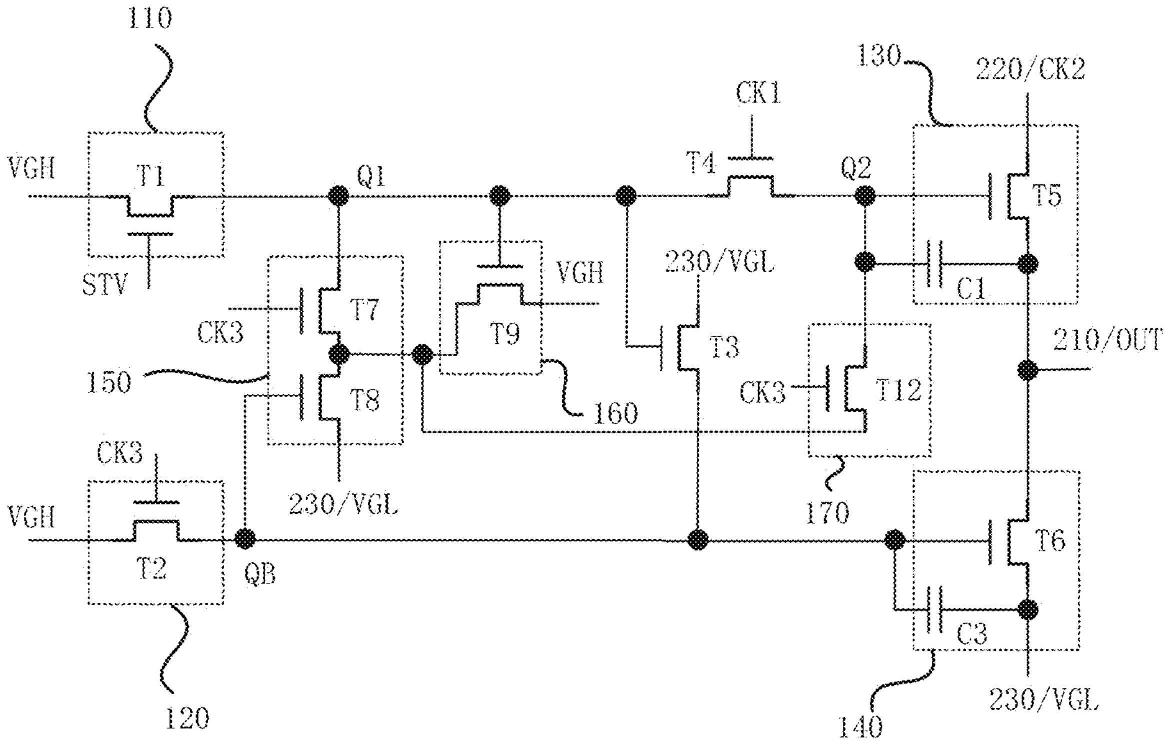
FIG. 27 is another circuit diagram of a shift register provided in an embodiment of the present disclosure.

FIG. 27 is another circuit diagram of a shift register provided in an embodiment of the present disclosure. Referring to FIG. 1 and FIG. 27, the first output signal terminal OUT of the current stage shift register 100 is connected to the cascade signal input terminal STV of the next stage shift register 100. The circuit of the shift register shown in FIG. 27 applies to the driving timing shown in FIG. 25.

Figure 28:
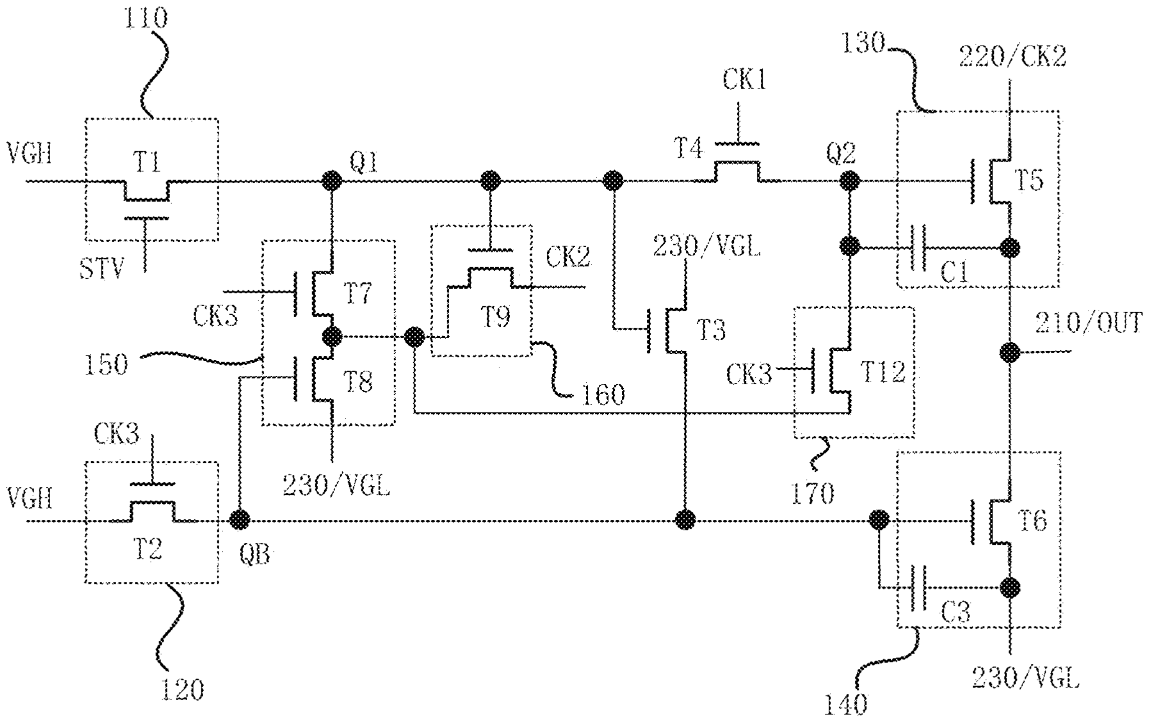
FIG. 28 is another circuit diagram of a shift register provided in an embodiment of the present disclosure.

FIG. 28 is another circuit diagram of a shift register provided in an embodiment of the present disclosure. Referring to FIG. 28, the second electrode of the turn-off transistor T9 is connected to the second clock signal terminal 220. The circuit of the shift register shown in FIG. 28 applies to the driving timing shown in FIG. 25.

Figure 29:
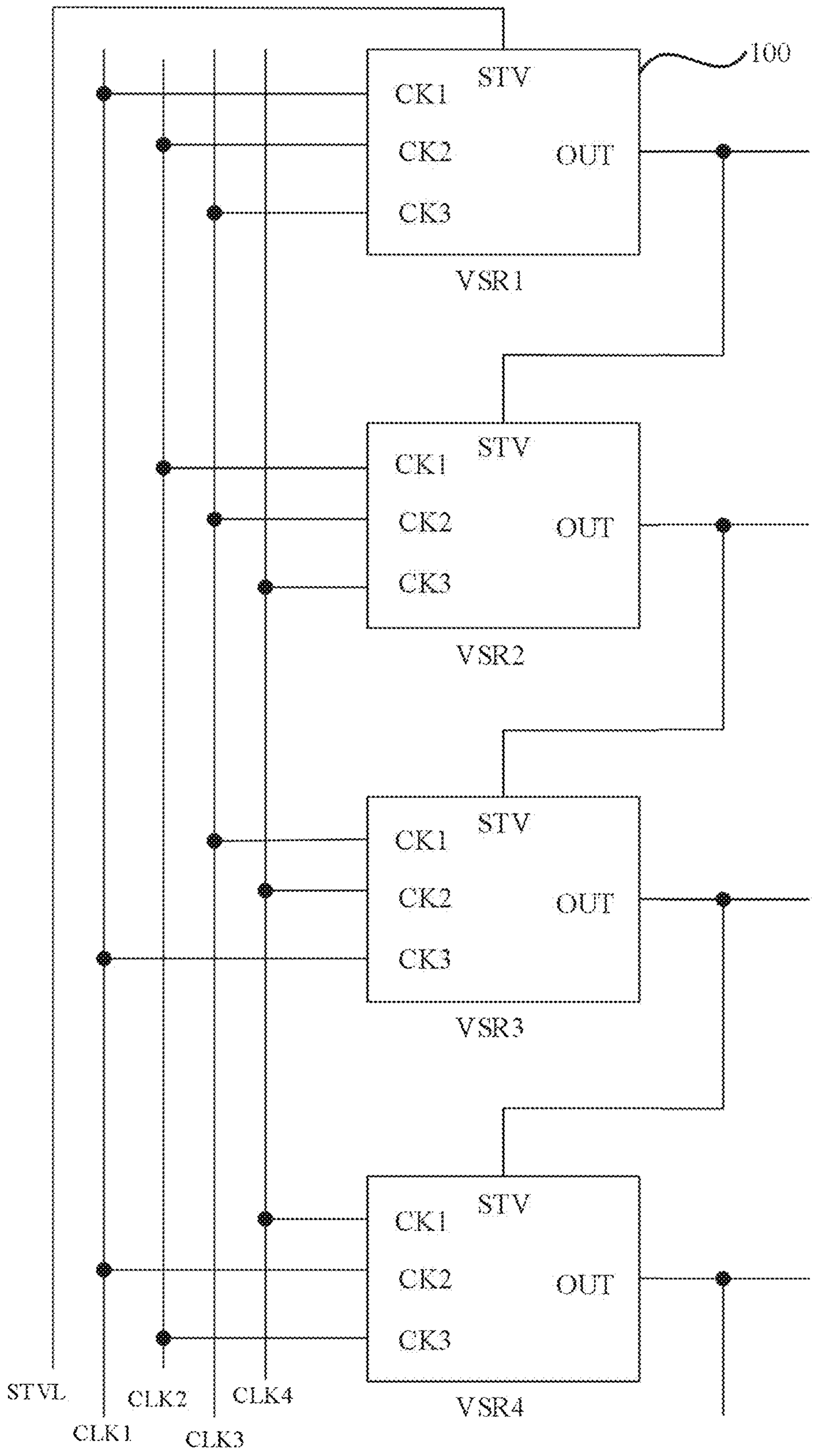
FIG. 29 is another circuit diagram of a gate driving circuit provided in an embodiment of the present disclosure.

FIG. 29 is another circuit diagram of a gate driving circuit provided in an embodiment of the present disclosure. Referring to FIG. 29, the gate driving circuit further includes a first clock signal line CLK1, a second clock signal line CLK2, a third clock signal line CLK3, and a fourth clock signal line CLK4. The first clock signal line CLK1 is electrically connected to the first clock signal terminal CK1 of an $i^{th}$ shift register 100, the third clock signal terminal CK3 of an $(i+2)^{th}$ shift register 100, and the second clock signal terminal 220 of an $(i+3)^{th}$ shift register 100. The second clock signal line CLK2 is electrically connected to the second clock signal terminal 220 of the $i^{th}$ shift register 100, the first clock signal terminal CK1 of an $(i+1)^{th}$ shift register 100, and the third clock signal terminal CK3 of the $(i+3)^{th}$ shift register 100. The third clock signal line CLK3 is electrically connected to the third clock signal terminal CK3 of the $i^{th}$ shift register 100, the second clock signal terminal 220 of the $(i+1)^{th}$ shift register 100, and the first clock signal terminal CK1 of the $(i+2)^{th}$ shift register 100. The fourth clock signal line CLK4 is electrically connected to the third clock signal terminal CK3 of the $(i+1)^{th}$ shift register 100, the second clock signal terminal 220 of the $(i+2)^{th}$ shift register 100, and the first clock signal terminal CK1 of the $(i+3)^{th}$ shift register 100. The first clock signal line CLK1, the second clock signal line CLK2, the third clock signal line CLK3, and the fourth clock signal line CLK4 provide corresponding clock signals for the clock signal terminals connected thereto. i is a positive integer.

Exemplarily, referring to FIG. 29, multiple cascaded shift registers 100 include a first shift register VSR1, a second shift register VSR2, a third shift register VSR3, and a fourth shift register VSR4. The first clock signal line CLK1 is electrically connected to the first clock signal terminal CK1 of the first shift register VSR1, the third clock signal terminal CK3 of the third shift register VSR3, and the second clock signal terminal 220 of the fourth shift register VSR4. The second clock signal line CLK2 is electrically connected to the second clock signal terminal 220 of the first shift register VSR1, the first clock signal terminal CK1 of the second shift register VSR2, and the third clock signal terminal CK3 of the fourth shift register VSR4. The third clock signal line CLK3 is electrically connected to the third clock signal terminal CK3 of the first shift register VSR1, the second clock signal terminal 220 of the second shift register VSR2, and the first clock signal terminal CK1 of the third shift register VSR3. The fourth clock signal line CLK4 is electrically connected to the third clock signal terminal CK3 of the second shift register VSR2, the second clock signal terminal 220 of the third shift register VSR3, and the first clock signal terminal CK1 of the fourth shift register VSR4.

Exemplarily, referring to FIG. 29, the gate driving circuit further includes an initial signal line STVL, and the initial signal line STVL is electrically connected to the cascade signal input terminal STV of the first shift register VSR1.

Exemplarily, referring to FIG. 12 and FIG. 29, the driving timing shown in FIG. 12 may be the driving timing of the first shift register VSR1. The first clock signal line CLK1 is electrically connected to the first clock signal terminal CK1 of the first shift register VSR1, and provides a clock signal to the first clock signal terminal CK1 of the first shift register VSR1. The second clock signal line CLK2 is electrically connected to the second clock signal terminal 220 of the first shift register VSR1, and provides a clock signal to the second clock signal terminal 220 of the first shift register VSR1. The third clock signal line CLK3 is electrically connected to the third clock signal terminal CK3 of the first shift register VSR1, and provides a clock signal to the third clock signal terminal CK3 of the first shift register VSR1.

Figure 30:
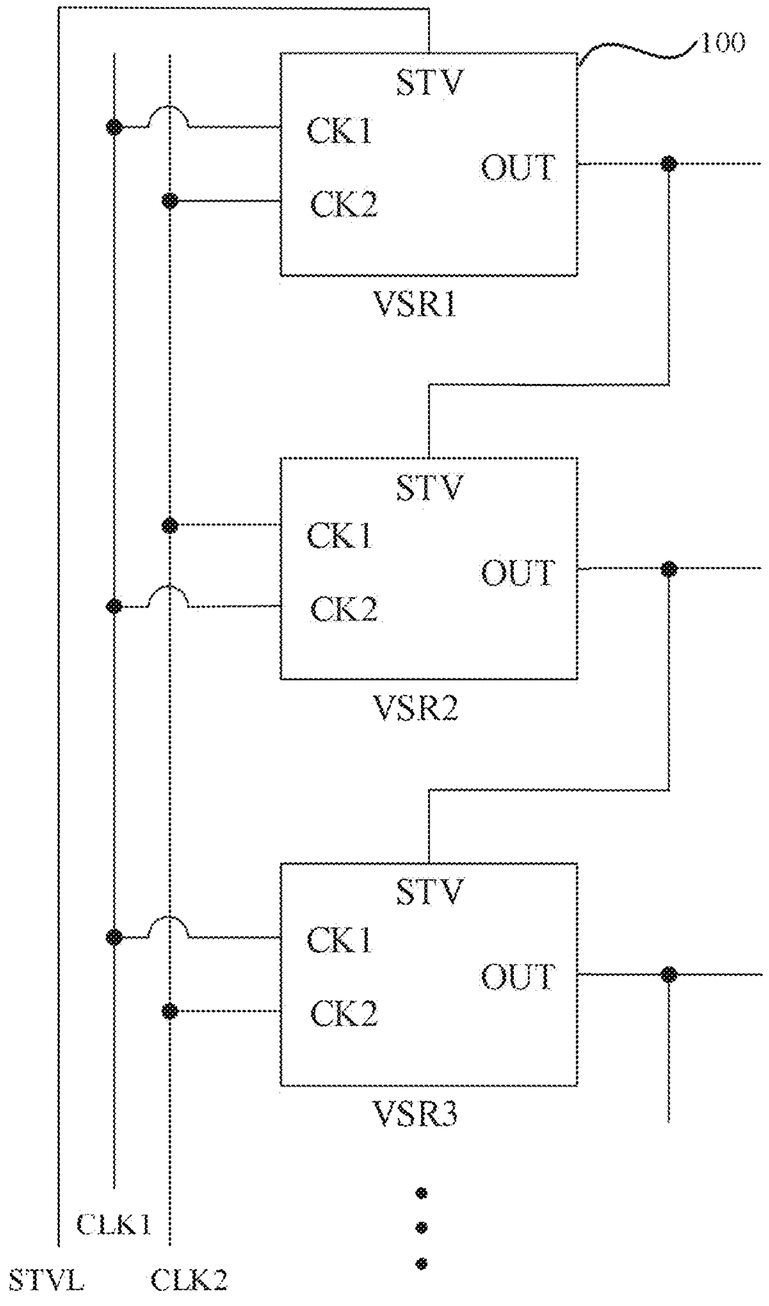
FIG. 30 is another circuit diagram of a gate driving circuit provided in an embodiment of the present disclosure.

FIG. 30 is another circuit diagram of a gate driving circuit provided in an embodiment of the present disclosure. Referring to FIG. 30, the gate driving circuit further includes a first clock signal line CLK1 and a second clock signal line CLK2. The first clock signal line CLK1 is electrically connected to the first clock signal terminal CK1 of an $i^{th}$ shift register 100 and the second clock signal terminal 220 of an $(i+1)^{th}$ shift register 100. The second clock signal line CLK2 is electrically connected to the second clock signal terminal 220 of the $i^{th}$ shift register 100 and the first clock signal terminal CK1 of the $(i+1)^{th}$ shift register 100. The first clock signal line CLK1 and the second clock signal line CLK2 provide corresponding clock signals to the clock signal terminals connected thereto. i is a positive integer.

Exemplarily, referring to FIG. 30, multiple cascaded shift registers 100 include a first shift register VSR1, a second shift register VSR2, and a third shift register VSR3. The first clock signal line CLK1 is electrically connected to the first clock signal terminal CK1 of the first shift register VSR1 and the second clock signal terminal 220 of the second shift register VSR2. The second clock signal line CLK2 is electrically connected to the second clock signal terminal 220 of the first shift register VSR1 and the first clock signal terminal CK1 of the second shift register VSR2.

Exemplarily, referring to FIG. 19 and FIG. 30, the driving timing shown in FIG. 19 may be the driving timing of the first shift register VSR1. The first clock signal line CLK1 is electrically connected to the first clock signal terminal CK1 of the first shift register VSR1, and provides a clock signal to the first clock signal terminal CK1 of the first shift register VSR1. The second clock signal line CLK2 is electrically connected to the second clock signal terminal 220 of the first shift register VSR1, and provides a clock signal to the second clock signal terminal 220 of the first shift register VSR1.

Figure 31:
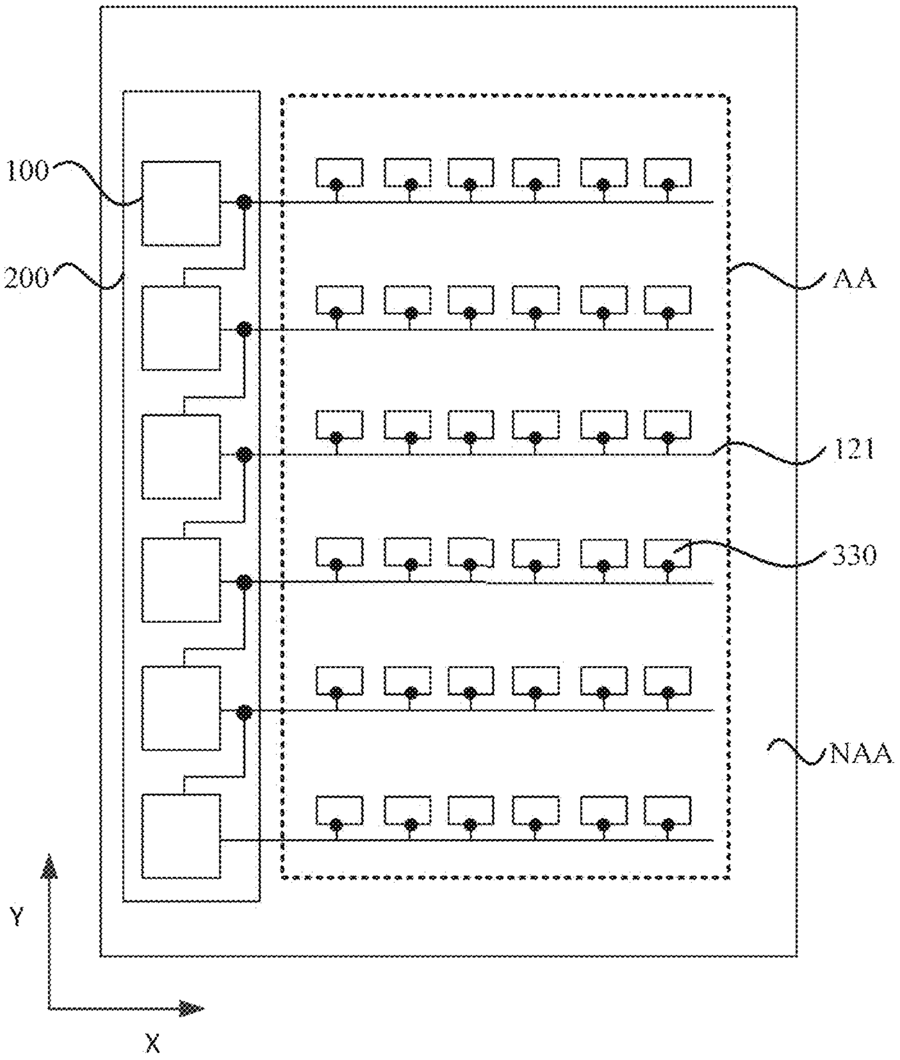
FIG. 31 is a schematic diagram of a display panel provided in an embodiment of the present disclosure.

FIG. 31 is a schematic diagram of a display panel provided in an embodiment of the present disclosure. Referring to FIG. 31, the display panel includes the gate driving circuit 200 in the above embodiments. Since the display panel provided in the embodiment of the present disclosure includes the gate driving circuit 200 in the above embodiments, the shift register 100 in the gate driving circuit 200 can have a smaller leakage.

Exemplarily, referring to FIG. 31, the display panel includes a display area AA and a non-display area NAA, the gate driving circuit 200 is located in the non-display area NAA, a pixel driving circuit 330 is located in the display area AA, and multiple pixel driving circuits 330 are arranged in an array in a first direction X and a second direction Y. The display panel further includes multiple scan lines 121, and the multiple scan lines 121 extend in the first direction X and are arranged in the second direction Y. The first output signal terminal OUT of the shift register 100 is electrically connected to a scan line 121. The pixel driving circuit 330 may be embodied as a pixel driving circuit known in the related art such as 2T1C or 7T1C, which will not be described herein.

Figure 32:
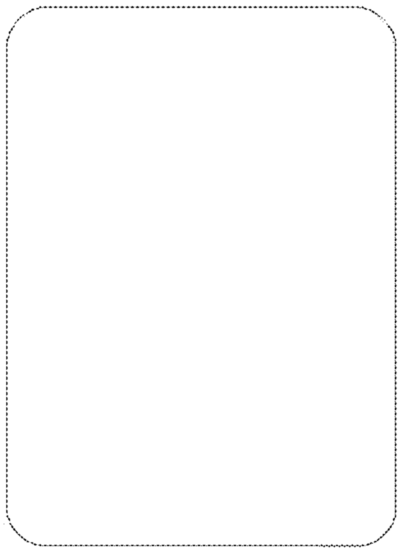
FIG. 32 is a schematic diagram of a display device provided in an embodiment of the present disclosure.

FIG. 32 is a schematic diagram of a display device provided in an embodiment of the present disclosure. Referring to FIG. 32, the display device includes any display panel provided in an embodiment of the present disclosure. The display device may be a mobile phone, a tablet computer, a vehicle-mounted display device and a smart wearable apparatus, etc.

Note that the above is only example embodiments of the present disclosure and the technical principles used. The person skilled in the art will appreciate that the present disclosure is not limited to the embodiments described herein, and that various obvious changes, readjustments, combinations and substitutions can be made by the person skilled in the art without departing from the scope of protection of the present disclosure. Therefore, although the present disclosure has been described in more detail through the above embodiments, the present disclosure is not limited to the above embodiments, and may include more other equivalent embodiments without departing from the concept of the present disclosure, and the scope of the present disclosure is determined by the scope of the appended claims.

What is claimed is:

1. A gate driving circuit, comprising a plurality of cascaded shift registers, wherein a shift register of the plurality of cascaded shift registers comprises a first input unit, a second input unit, a first output unit, a second output unit, a first reset unit and a turn-off unit;

an output terminal of the first input unit and a control terminal of the first output unit are connected to a first node, and an output terminal of the second input unit and a control terminal of the second output unit are connected to a third node;

the first reset unit is configured to write a turn-off voltage into the first node, and the turn-off voltage is a voltage for controlling the first output unit to turn off; the first reset unit comprises a first reset transistor, a gate of the first reset transistor is connected to a first clock signal terminal or a third clock signal terminal, and a first electrode of the first reset transistor is connected to the first node; and a control terminal of the turn-off unit is connected to the first node, a first terminal of the turn-off unit is connected to a second electrode of the first reset transistor and is configured to write a turn-on voltage into the second electrode of the first reset transistor in response to the first node controlling the turn-off unit to turn on, and the turn-on voltage is a voltage for controlling the first output unit to turn on;

wherein the shift register further comprises an isolation transistor, a gate of the isolation transistor is connected to the first clock signal terminal, a first electrode of the isolation transistor is connected to the first node, and a second electrode of the isolation transistor and the control terminal of the first output unit are connected to a second node; or wherein the first reset unit further comprises a second reset transistor, a gate of the second reset transistor is connected to the third node, a first electrode of the second reset transistor is connected to the second electrode of the first reset transistor, a second electrode of the second reset transistor is connected to a second power supply voltage terminal, and the second power supply voltage terminal provides the turn-off voltage.

2. The gate driving circuit according to claim 1, wherein the turn-off unit comprises a turn-off transistor, a gate of the turn-off transistor is connected to the first node, and a first electrode of the turn-off transistor is connected to the second electrode of the first reset transistor.

3. The gate driving circuit according to claim 2, wherein a second electrode of the turn-off transistor is connected to a first power supply voltage terminal, and the first power supply voltage terminal provides the turn-on voltage.

4. The gate driving circuit according to claim 2, wherein a second electrode of the turn-off transistor is connected to the first clock signal terminal or a second clock signal terminal.

5. The gate driving circuit according to claim 1, wherein in response to the shift register comprising the isolation transistor, the first output unit comprises a first output transistor and a first capacitor, a gate of the first output transistor is connected to the second node, a first electrode of the first output transistor is connected to a second clock signal terminal, and a second electrode of the first output transistor is connected to an output signal terminal.

6. The gate driving circuit according to claim 5, wherein the shift register further comprises a second capacitor, a first plate of the second capacitor is connected to the first node, a second plate of the second capacitor is connected to the second power supply voltage terminal, and the second power supply voltage terminal provides the turn-off voltage; and a capacitance value of the second capacitor is greater than a capacitance value of the first capacitor.

7. The gate driving circuit according to claim 5, wherein the second clock signal terminal comprises a second clock first sub-signal terminal and a second clock second sub-signal terminal, and a voltage provided by the second clock first sub-signal terminal and a voltage provided by the second clock second sub-signal terminal have a same timing and different voltage values;

the output signal terminal comprises a first output signal terminal and a second output signal terminal; the first electrode of the first output transistor is connected to the second clock first sub-signal terminal, and the second electrode of the first output transistor is connected to the first output signal terminal; and the first output unit further comprises a second output transistor, a gate of the second output transistor is connected to the second node, a first electrode of the second output transistor is connected to the second clock first sub-signal terminal or the second clock second sub-signal terminal, and a second electrode of the second output transistor is connected to the second output signal terminal.

8. The gate driving circuit according to claim 1, wherein the first input unit comprises a first input transistor, a gate of the first input transistor is connected to a cascade signal input terminal, a first electrode of the first input transistor is connected to a first power supply voltage terminal, the first power supply voltage terminal provides the turn-on voltage, and a second electrode of the first input transistor is connected to the first node.

9. The gate driving circuit according to claim 1, wherein the gate of the first reset transistor is connected to the first clock signal terminal, and the second electrode of the first reset transistor is connected to the output terminal of the first input unit.

10. The gate driving circuit according to claim 9, wherein the first input unit comprises a first input transistor, a gate of the first input transistor is connected to the first clock signal terminal, a first electrode of the first input transistor is connected to a cascade signal input terminal, and a second electrode of the first input transistor is connected to the second electrode of the first reset transistor.

11. The gate driving circuit according to claim 1, wherein in response to the shift register comprising the isolation transistor, the shift register further comprises a second reset unit, and the second reset unit is configured to write the turn-off voltage into the second node;

the second reset unit comprises a fourth reset transistor, a gate of the fourth reset transistor is connected to the third clock signal terminal; and a first electrode of the fourth reset transistor is connected to the second node; and the first terminal of the turn-off unit is connected to a second electrode of the fourth reset transistor and is configured to write the turn-on voltage into the second electrode of the fourth reset transistor, in response to the first node controlling the turn-off unit to turn on.

12. The gate driving circuit according to claim 11, wherein the second reset unit further comprises a fifth reset transistor; and a gate of the fifth reset transistor is connected to the third clock signal terminal, a first electrode of the fifth reset transistor is connected to the second electrode of the fourth reset transistor, a second electrode of the fifth reset transistor is connected to the second power supply voltage terminal, and the second power supply voltage terminal provides the turn-off voltage.

13. The gate driving circuit according to claim 1, further comprising a first clock signal line and a second clock signal line; wherein the first clock signal line is electrically connected to a first clock signal terminal of an $i^{th}$ shift register and a second clock signal terminal of an $(i+1)^{th}$ shift register; and the second clock signal line is electrically connected to a second clock signal terminal of the $i^{th}$ shift register and a first clock signal terminal of the $(i+1)^{th}$ shift register; wherein i is a positive integer.

14. A gate driving circuit, comprising a plurality of cascaded shift registers, wherein a shift register of the plurality of cascaded shift registers comprises a first input unit, a second input unit, a first output unit, a second output unit, a first reset unit and a turn-off unit;

an output terminal of the first input unit and a control terminal of the first output unit are connected to a first node, and an output terminal of the second input unit and a control terminal of the second output unit are connected to a third node;

the first reset unit is configured to write a turn-off voltage into the first node, and the turn-off voltage is a voltage for controlling the first output unit to turn off; the first reset unit comprises a first reset transistor, a gate of the first reset transistor is connected to a first clock signal terminal or a third clock signal terminal, and a first electrode of the first reset transistor is connected to the first node; and a control terminal of the turn-off unit is connected to the first node, a first terminal of the turn-off unit is connected to a second electrode of the first reset transistor and is configured to write a turn-on voltage into the second electrode of the first reset transistor in response to the first node controlling the turn-off unit to turn on, and the turn-on voltage is a voltage for controlling the first output unit to turn on;

wherein the shift register comprises a second power supply voltage terminal for providing the turn-off voltage, the second power supply voltage terminal comprises a second power supply first sub-voltage terminal and a second power supply second sub-voltage terminal, and a voltage provided by the second power supply first sub-voltage terminal is greater than a voltage provided by the second power supply second sub-voltage terminal; the second output unit comprises a third output transistor, a gate of the third output transistor is connected to the third node, a first electrode of the third output transistor is connected to the second power supply second sub-voltage terminal, and a second electrode of the third output transistor is connected to an output signal terminal; and the shift register further comprises a third reset transistor, a gate of the third reset transistor is connected to the first node, a first electrode of the third reset transistor is connected to the third node, and a second electrode of the third reset transistor is connected to the second power supply second sub-voltage terminal; or wherein the gate driving circuit further comprising a first clock signal line, a second clock signal line, a third clock signal line, and a fourth clock signal line; the first clock signal line is electrically connected to a first clock signal terminal of an $i^{th}$ shift register, a third clock signal terminal of an $(i+2)^{th}$ shift register and a second clock signal terminal of an $(i+3)^{th}$ shift register; the second clock signal line is electrically connected to a second clock signal terminal of the $i^{th}$ shift register, a first clock signal terminal of an $(i+1)^{th}$ shift register, and a third clock signal terminal of the $(i+3)^{th}$ shift register; the third clock signal line is electrically connected to a third clock signal terminal of the $i^{th}$ shift register, a second clock signal terminal of the $(i+1)^{th}$ shift register, and a first clock signal terminal of the $(i+2)^{th}$ shift register; and the fourth clock signal line is electrically connected to a third clock signal terminal of the $(i+1)^{th}$ shift register, a second clock signal terminal of the $(i+2)^{th}$ shift register, and a first clock signal terminal of the $(i+3)^{th}$ shift register; and wherein i is a positive integer.

15. A display panel, comprising the gate driving circuit according to claim 14.

16. The display panel according to claim 15, wherein the turn-off unit comprises a turn-off transistor, a gate of the turn-off transistor is connected to the first node, and a first electrode of the turn-off transistor is connected to the second electrode of the first reset transistor.

17. A display device, comprising the display panel according to claim 15.

18. A display panel, comprising a gate driving circuit, wherein the gate driving circuit comprises a plurality of cascaded shift registers, and a shift register of the plurality of cascaded shift registers comprises a first input unit, a second input unit, a first output unit, a second output unit, a first reset unit and a turn-off unit;

an output terminal of the first input unit and a control terminal of the first output unit are connected to a first node, and an output terminal of the second input unit and a control terminal of the second output unit are connected to a third node;

the first reset unit is configured to write a turn-off voltage into the first node, and the turn-off voltage is a voltage for controlling the first output unit to turn off; the first reset unit comprises a first reset transistor, a gate of the first reset transistor is connected to a first clock signal terminal or a third clock signal terminal, and a first electrode of the first reset transistor is connected to the first node; and a control terminal of the turn-off unit is connected to the first node, a first terminal of the turn-off unit is connected to a second electrode of the first reset transistor and is configured to write a turn-on voltage into the second electrode of the first reset transistor in response to the first node controlling the turn-off unit to turn on, and the turn-on voltage is a voltage for controlling the first output unit to turn on;

wherein the shift register further comprises an isolation transistor, a gate of the isolation transistor is connected to the first clock signal terminal, a first electrode of the isolation transistor is connected to the first node, and a second electrode of the isolation transistor and the control terminal of the first output unit are connected to a second node; or wherein the first reset unit further comprises a second reset transistor, a gate of the second reset transistor is connected to the third node, a first electrode of the second reset transistor is connected to the second electrode of the first reset transistor, a second electrode of the second reset transistor is connected to a second power supply voltage terminal, and the second power supply voltage terminal provides the turn-off voltage.

19. The display panel according to claim 18, wherein the turn-off unit comprises a turn-off transistor, a gate of the turn-off transistor is connected to the first node, and a first electrode of the turn-off transistor is connected to the second electrode of the first reset transistor.

20. A display device, comprising the display panel according to claim 18.

* * * * *